(12) United States Patent
Danek et al.

(10) Patent No.: US 8,685,867 B1
(45) Date of Patent: Apr. 1, 2014

(54) PREMETAL DIELECTRIC INTEGRATION PROCESS

(75) Inventors: Michal Danek, Cupertino, CA (US); Bart van Schravendijk, Sunnyvale, CA (US); Nerissa Draeger, Fremont, CA (US); Lakshminarayana Nittala, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/315,123

(22) Filed: Dec. 8, 2011

Related U.S. Application Data

(60) Provisional application No. 61/421,548, filed on Dec. 9, 2010, provisional application No. 61/492,319, filed on Jun. 1, 2011.

(51) Int. Cl.
*H01L 21/311* (2006.01)
*H01L 21/00* (2006.01)

(52) U.S. Cl.
USPC .................. 438/787; 438/758; 257/E21.001

(58) Field of Classification Search
None
See application file for complete search history.

(56) References Cited

U.S. PATENT DOCUMENTS

| | | | |
|---|---|---|---|
| 4,099,990 A | 7/1978 | Brown et al. | |
| 4,740,480 A | 4/1988 | Ooka | |
| 4,923,720 A | 5/1990 | Lee et al. | |
| 5,281,274 A | 1/1994 | Yoder | |
| 5,320,983 A | 6/1994 | Ouellet | |
| 5,387,546 A * | 2/1995 | Maeda et al. | 438/784 |
| 5,516,721 A | 5/1996 | Galli et al. | |
| 5,525,157 A | 6/1996 | Hawkins et al. | |
| 5,534,731 A | 7/1996 | Cheung | |
| 5,747,381 A * | 5/1998 | Wu et al. | 438/624 |
| 5,807,785 A | 9/1998 | Ravi | |
| 5,840,631 A | 11/1998 | Kubo et al. | |
| 5,858,880 A | 1/1999 | Dobson et al. | |
| 5,874,367 A | 2/1999 | Dobson | |
| 5,899,751 A | 5/1999 | Chang et al. | |
| 5,902,127 A | 5/1999 | Park | |
| 5,932,289 A | 8/1999 | Dobson et al. | |
| 6,013,581 A * | 1/2000 | Wu et al. | 438/734 |
| 6,060,384 A | 5/2000 | Chen et al. | |
| 6,114,259 A * | 9/2000 | Sukharev et al. | 438/789 |

(Continued)

FOREIGN PATENT DOCUMENTS

WO  2011072143  6/2011

OTHER PUBLICATIONS

U.S. Office Action mailed Aug. 23, 2005, from U.S. Appl. No. 10/810,066.

(Continued)

*Primary Examiner* — Scott B Geyer
*Assistant Examiner* — Evren Seven
(74) *Attorney, Agent, or Firm* — Weaver Austin Villeneuve & Sampson LLP

(57) ABSTRACT

Provided herein are novel pre-metal dielectric (PMD) integration schemes. According to various embodiments, the methods involve depositing flowable dielectric material to fill trenches or other gaps between gate structures in a front end of line (FEOL) fabrication process. The flowable dielectric material may be partially densified to form dual density filled gaps having a low density region capped by a high density region. In certain embodiments, the methods include further treating at least a portion of the gap fill material after subsequent process operations such as chemical mechanical planarization (CMP) or contact etching.

26 Claims, 23 Drawing Sheets

(56) References Cited

U.S. PATENT DOCUMENTS

| | | | |
|---|---|---|---|
| 6,143,626 A | 11/2000 | Yabu et al. | |
| 6,207,535 B1 | 3/2001 | Lee et al. | |
| 6,218,268 B1 | 4/2001 | Xia et al. | |
| 6,242,366 B1 | 6/2001 | Beekman et al. | |
| 6,287,989 B1 | 9/2001 | Dobson | |
| 6,300,219 B1 | 10/2001 | Doan et al. | |
| 6,309,933 B1* | 10/2001 | Li et al. | 438/291 |
| 6,323,123 B1* | 11/2001 | Liu et al. | 438/638 |
| 6,383,951 B1 | 5/2002 | Li | |
| 6,399,213 B2 | 6/2002 | Shiokawa | |
| 6,413,583 B1 | 7/2002 | Moghadam et al. | |
| 6,475,564 B1 | 11/2002 | Carter et al. | |
| 6,544,858 B1 | 4/2003 | Beekman et al. | |
| 6,635,586 B2* | 10/2003 | Goo et al. | 438/782 |
| 6,640,840 B1 | 11/2003 | MacNeil | |
| 6,653,247 B2 | 11/2003 | MacNeil | |
| 6,743,436 B1 | 6/2004 | Lee | |
| 6,743,736 B2 | 6/2004 | Mardian et al. | |
| 6,787,463 B2 | 9/2004 | Mardian et al. | |
| 6,790,737 B2 | 9/2004 | Schneegans et al. | |
| 6,812,135 B2* | 11/2004 | Li et al. | 438/628 |
| 6,828,162 B1 | 12/2004 | Halliyal et al. | |
| 6,846,757 B2 | 1/2005 | MacNeil | |
| 6,902,947 B2 | 6/2005 | Chinn et al. | |
| 6,972,262 B2* | 12/2005 | Lee et al. | 438/706 |
| 6,984,561 B2 | 1/2006 | Herner et al. | |
| 6,995,056 B2* | 2/2006 | Lee et al. | 438/233 |
| 7,033,945 B2 | 4/2006 | Byun et al. | |
| 7,056,560 B2 | 6/2006 | Yim et al. | |
| 7,071,126 B2* | 7/2006 | Johnston et al. | 438/783 |
| 7,074,690 B1 | 7/2006 | Gauri et al. | |
| 7,153,783 B2 | 12/2006 | Lu et al. | |
| 7,238,604 B2* | 7/2007 | Kloster et al. | 438/619 |
| 7,365,000 B2* | 4/2008 | Lee et al. | 438/618 |
| 7,498,273 B2 | 3/2009 | Mallick et al. | |
| 7,521,378 B2 | 4/2009 | Fucsko et al. | |
| 7,524,735 B1 | 4/2009 | Gauri et al. | |
| 7,575,633 B2 | 8/2009 | Romanin | |
| 7,582,555 B1 | 9/2009 | Lang et al. | |
| 7,585,704 B2 | 9/2009 | Belyansky et al. | |
| 7,589,012 B1* | 9/2009 | Seo et al. | 438/618 |
| 7,622,369 B1 | 11/2009 | Lee et al. | |
| 7,629,227 B1 | 12/2009 | Wang et al. | |
| 7,655,532 B1* | 2/2010 | Chen et al. | 438/424 |
| 7,804,130 B1* | 9/2010 | Fung | 257/330 |
| 7,825,044 B2* | 11/2010 | Mallick et al. | 438/789 |
| 7,888,233 B1 | 2/2011 | Gauri et al. | |
| 7,888,273 B1 | 2/2011 | Wang et al. | |
| 7,915,139 B1 | 3/2011 | Lang et al. | |
| 8,187,951 B1 | 5/2012 | Wang et al. | |
| 8,278,224 B1 | 10/2012 | Mui et al. | |
| 8,557,712 B1 | 10/2013 | Antonelli et al. | |
| 2002/0006729 A1 | 1/2002 | Geiger et al. | |
| 2003/0066482 A1 | 4/2003 | Pokharna et al. | |
| 2003/0077887 A1 | 4/2003 | Jang et al. | |
| 2003/0146416 A1 | 8/2003 | Takei et al. | |
| 2003/0159655 A1 | 8/2003 | Lin et al. | |
| 2003/0194861 A1 | 10/2003 | Mardian et al. | |
| 2003/0210065 A1 | 11/2003 | Lu et al. | |
| 2004/0048455 A1 | 3/2004 | Karasawa et al. | |
| 2004/0152342 A1 | 8/2004 | Li et al. | |
| 2004/0169005 A1* | 9/2004 | Kim et al. | 216/13 |
| 2004/0224496 A1 | 11/2004 | Cui et al. | |
| 2005/0026443 A1* | 2/2005 | Goo et al. | 438/694 |
| 2005/0112282 A1 | 5/2005 | Gordon | |
| 2005/0136684 A1 | 6/2005 | Mukai et al. | |
| 2005/0150453 A1 | 7/2005 | Simmons et al. | |
| 2005/0181566 A1 | 8/2005 | Machida et al. | |
| 2005/0212179 A1* | 9/2005 | Honda et al. | 264/480 |
| 2005/0260864 A1 | 11/2005 | Huang et al. | |
| 2006/0014384 A1 | 1/2006 | Lee et al. | |
| 2006/0024912 A1 | 2/2006 | Lee | |
| 2006/0216946 A1 | 9/2006 | Usami et al. | |
| 2006/0223290 A1 | 10/2006 | Belyansky et al. | |
| 2006/0269693 A1 | 11/2006 | Balseanu et al. | |
| 2006/0270217 A1 | 11/2006 | Balseanu et al. | |
| 2007/0054505 A1 | 3/2007 | Antonelli et al. | |
| 2007/0281495 A1 | 12/2007 | Mallick et al. | |
| 2007/0298585 A1 | 12/2007 | Lubomirsky et al. | |
| 2008/0020591 A1 | 1/2008 | Balseanu et al. | |
| 2008/0081434 A1 | 4/2008 | Nam et al. | |
| 2009/0020847 A1 | 1/2009 | Byun et al. | |
| 2009/0053895 A1* | 2/2009 | Oshima et al. | 438/692 |
| 2009/0061647 A1 | 3/2009 | Mallick et al. | |
| 2009/0104789 A1 | 4/2009 | Mallick et al. | |
| 2009/0104790 A1 | 4/2009 | Liang | |
| 2009/0321936 A1 | 12/2009 | Kojima et al. | |
| 2010/0109155 A1* | 5/2010 | Liu et al. | 257/734 |
| 2010/0167533 A1 | 7/2010 | Lim et al. | |
| 2011/0081782 A1 | 4/2011 | Liang et al. | |
| 2011/0151678 A1 | 6/2011 | Ashtiani et al. | |
| 2012/0149213 A1 | 6/2012 | Nittala et al. | |
| 2012/0161405 A1 | 6/2012 | Mohn et al. | |
| 2013/0230987 A1 | 9/2013 | Draeger et al. | |

OTHER PUBLICATIONS

Lang et al., "CVD Flowable Gap Fill," Novellus Systems, Inc., U.S. Appl. No. 11/323,812, filed Dec. 29, 2005, pp. 1-21.

Notice of Allowance and Fee Due mailed Feb. 15, 2006 from U.S. Appl. No. 10/810,066.

Allowed Claims from U.S. Appl. No. 10/810,066.

Gauri et al., "Flowable Film Dielectric Gap Fill Process," Novellus Systems, Inc., U.S. Appl. No. 11/447,594, filed Jun. 5, 2006.

U.S. Office Action mailed Jun. 27, 2008, from U.S. Appl. No. 11/447,594.

U.S. Office Action mailed Oct. 26, 2007, from U.S. Appl. No. 11/323,812.

U.S. Office Action mailed Apr. 9, 2008, from U.S. Appl. No. 11/323,812.

U.S. Office Action mailed Oct. 9, 2008, from U.S. Appl. No. 11/323,812.

Wang, et al., "CVD Flowable Gap Fill," Novellus Systems, Inc., U.S. Appl. No. 11/925,514, filed Oct. 26, 2007.

Wang, et al., "Density Gradient-Free Gap Fill," Novellus Systems, Inc., U.S. Appl. No. 11/834,581, filed Aug. 6, 2007.

Notice of Allowance and Fee Due mailed Dec. 11, 2008, from U.S. Appl. No. 11/447,594.

Allowed Claims from U.S. Appl. No. 11/447,594.

U.S. Office Action mailed Nov. 4, 2008, from U.S. Appl. No. 11/925,514.

U.S. Office Action mailed Nov. 12, 2008, from U.S. Appl. No. 11/834,581.

Antonelli et al., "PECVD Flowable Dielectric Gap Fill," Novellus Systems, Inc., U.S. Appl. No. 12/334,726, filed Dec. 15, 2008.

Gauri et al., "Flowable Film Dielectric Gap Fill Process," Novellus Systems, Inc., U.S. Appl. No. 12/411,243, filed Mar. 25, 2009.

Notice of Allowance and Fee Due mailed Apr. 23, 2009 from U.S. Appl. No. 11/323,812.

Allowed Claims from U.S. Appl. No. 11/323,812.

U.S. Final Office Action mailed Jun. 17, 2009, from U.S. Appl. No. 11/925,514.

Notice of Allowance and Fee Due mailed Jul. 29, 2009 from U.S. Appl. No. 11/925,514.

Allowed Claims from U.S. Appl. No. 11/925,514.

Mui et al., "Flowable Oxide Deposition Using Rapid Delivery of Process Gases," Novellus Systems, Inc., U.S. Appl. No. 12/566,085, filed Sep. 24, 2009.

Lang et al., "CVD Flowable Gap Fill", Novellus Systems, Inc., U.S. Appl. No. 12/508,461, filed Jul. 23, 2009.

Chung, et al., "Flowable Oxide CVD Process for Shallow Trench Isolation in Silicon Semiconductor," Journal of Semiconductor Technology and Science, vol. 4, No. 1, Mar. 2004, pp. 45-51.

U.S. Final Office Action mailed Aug. 6, 2009, from U.S. Appl. No. 11/834,581.

U.S. Office Action mailed Dec. 18, 2009, from U.S. Appl. No. 11/834,581.

Wang et al., "CVD Flowable Gap Fill", Novellus Systems, Inc., U.S. Appl. No. 12/625,468, filed Nov. 24, 2009.

(56) References Cited

OTHER PUBLICATIONS

U.S. Office Action mailed Feb. 26, 2010, from U.S. Appl. No. 12/334,726.
U.S. Final Office Action mailed Apr. 22, 2010, for U.S. Appl. No. 11/834,581.
U.S. Office Action mailed May 24, 2010, for U.S. Appl. No. 12/411,243.
U.S. Final Office Action mailed Sep. 13, 2010 for U.S. Appl. No. 12/411,243.
U.S. Final Office Action mailed Oct. 26, 2010 for U.S. Appl. No. 12/334,726.
Notice of Allowance mailed Oct. 6, 2010 for U.S. Appl. No. 12/411,243.
Allowed Claims for U.S. Appl. No. 12/411,243.
Notice of Allowance mailed Nov. 18, 2010 for U.S. Appl. No. 12/508,461.
Allowed Claims for U.S. Appl. No. 12/508,461.
Notice of Allowance mailed Oct. 7, 2010 for U.S. Appl. No. 11/834,581.
Allowed Claims for U.S. Appl. No. 11/834,581.
Ashtiani et al., "Novel Gap Fill Integration," Novellus Systems, Inc., U.S. Appl. No. 12/964,110, filed Dec. 9, 2010.
Lang et al., "CVD Flowable Gap Fill", Novellus Systems, Inc., U.S. Appl. No. 13/031,077, filed Feb. 18, 2011.
Matsuura, M., et al., "Novel Self-Planarizing CVD Oxide for Interlayer Dielectric Applications," IEEE, 1994, pp. 117-120.
Hatanaka, M., et al., "$H_2O$-TEOS Plasma-CVD Realizing Dielectrics Having a Smooth Surface," IEEE, VMIC Conference, Jun. 11-12, 1991, pp. 435-441.
Sakaue, H., et al., "Digital Chemical Vapor Deposition of $SiO_2$ Using a Repetitive Reaction of Triethylsilane /Hydrogen and Oxidation," Department of Electrical Engineering, Hiroshima University, published Nov. 17, 1990, pp. L 124-L 127.
Nakano, M., et al., "Digital CVD of $SiO_2$," Extended Abstracts of the $21^{st}$ Conference on Solid State Devices and Materials, Tokyo, 1989, pp. 49-52.
Noguchi, S., et al., "Liquid Phase Oxidation Employing O Atoms Produced by Microwave Discharge and $Si(CH_3)_4$," Extended Abstracts of the $19^{th}$ Conference on Solid State Devices and Materials, Tokyo, 1987, pp. 451-454.
Chung, Sung-Woong, et al., "Novel Shallow Trench Isolation Process Using Flowable Oxide CVD for sub-100nm DRAM," IEEE, 2002, IEDM, pp. 233-236.
U.S. Office Action for U.S. Appl. No. 12/625,468 mailed Apr. 26, 2011.
Gauri et al., "Flowable Film Dielectric Gap Fill Process," Novellus Systems, Inc., U.S. Appl. No. 12/984,524, filed Jan. 4, 2011.
International Search Report and Written Opinion mailed Aug. 10, 2011 for Application No. PCT/US2010/059721.
U.S. Office Action for U.S. Appl. No. 12/334,726 mailed Sep. 16, 2011.
U.S. Office Action for U.S. Appl. No. 12/625,468 mailed Oct. 14, 2011.
Wang, et al., "Density Gradient-Free Gap Fill," Novellus Systems, Inc., U.S. Appl. No. 12/986,070, filed Jan. 6, 2011.
U.S. Office Action for U.S. Appl. No. 12/986,070 mailed Nov. 25, 2011.
Nittala, et al., "Bottom Up Fill in High Aspect Ratio Trenches," Novellus Systems, Inc., U.S. Appl. No. 13/313,735, filed Dec. 7, 2011.
Notice of Allowance for U.S. Appl. No. 12/625,468 mailed Jan. 31, 2012.
Allowed claims for U.S. Appl. No. 12/625,468 as of Jan. 31, 2012.
U.S. Appl. No. 13/461,287, filed May 1, 2012, entitled "CVD Flowable Gap Fill".
U.S. Appl. No. 13/607,511, filed Sep. 7, 2012, entitled "Flowable Oxide Deposition Using Rapid Delivery of Process Gases".
U.S. Appl. No. 13/493,936, filed Jun. 11, 2012, entitled "Flowable Oxide Film With Tunable Wet Etch Rate".
US Office Action, dated May 18, 2012, issued in U.S. Appl. No. 12/984,524.
US Final Office Action, dated Sep. 14, 2012, issued in U.S. Appl. No. 12/984,524.
US Notice of Allowance, dated Aug. 6, 2012, issued in U.S. Appl. No. 13/031,077.
US Final Office Action, dated Jun. 25, 2012, issued in U.S. Appl. No. 12/986,070.
US Final Office Action, dated Mar. 30, 2012, issued in U.S. Appl. No. 12/334,726.
US Notice of Allowance, dated Mar. 7, 2013, issued in U.S. Appl. No. 12/984,524.
US Final Office Action, dated Oct. 23, 2012, issued in U.S. Appl. No. 12/334,726.
US Notice of Allowance, dated May 29, 2012, issued in U.S. Appl. No. 12/566,085.
US Office Action, dated Dec. 21 2012, issued in U.S. Appl. No. 12/964,110.
Chinese Office Action mailed Jul. 20, 2012, issued in Application No. 200810187894.4.
U.S. Appl. No. 12/984,524, filed Jul. 3, 2013 entitled "Flowable Film Dielectric Gap Fill Process".
US Notice of Allowance, dated Jul. 8, 2013, issued in U.S. Appl. No. 13/031,077.
US Office Action, dated Aug. 15, 2013, issued in U.S. Appl. No. 13/461,287.
US Notice of Allowance, dated Jun. 10, 2013, issued in U.S. Appl. No. 12/334,726.
US Office Action, dated Jun. 21, 2013, issued in U.S. Appl. No. 13/607,511.
US Final Office Action, dated Sep. 12, 2013, issued in U.S. Appl. No. 12/964,110.
US Office Action, dated Sep. 12, 2013, issued in U.S. Appl. No. 13/493,936.
Chung, et al. (2004) "Flowable Oxide CVD Process for Shallow Trench Isolation in Silicon Semiconductor," Journal of Semiconductor Technology and Science, vol. 4, No. 1, pp. 45-51.

\* cited by examiner

O2 Plasma Treatment

Dense SiO created by shrinkage

Low density SiO etched by HF

901

N2 Plasma Treatment

903

SiON material with lower wet etch rate in HF

PREMETAL DIELECTRIC INTEGRATION PROCESS

CROSS-REFERENCE TO RELATED APPLICATIONS

This application claims benefit under 35 USC 119(e) of the following U.S. Provisional Patent Applications: U.S. Provisional Patent Application No. 61/421,548, filed Dec. 9, 2010 and U.S. Provisional Patent Application No. 61/492,319, filed Jun. 1, 2011, all of which are incorporated herein by this reference.

BACKGROUND OF THE INVENTION

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

SUMMARY OF THE INVENTION

Provided herein are novel pre-metal dielectric (PMD) integration schemes. According to various embodiments, the methods involve depositing flowable dielectric material to fill trenches or other gaps between gate structures in a front end of line (FEOL) fabrication process. The flowable dielectric material may be partially densified to form dual density filled gaps having a low density region capped by a high density region. In certain embodiments, the methods include further treating at least a portion of the gap fill material after subsequent process operations such as chemical mechanical planarization (CMP) or contact etching.

Also provided herein are processes for filling gaps with a flowable dielectric material having a reduced wet etch rate. In certain embodiments, the processes involve introducing a dopant into the flowable dielectric material. The dopant may be introduced in the deposition chemistry and/or a post-deposition anneal. In the same or other embodiments, the processes involve post-deposition treatments of deposited gap fill material, including densification or liner treatments. Gap fill processes for integration schemes in which the gap fill material is exposed to wet etchants are also provided. These gap fill processes may be used in any such integration scheme including FEOL PMD processes.

One aspect of the invention relates to a method for filling a recessed feature with dielectric material, the method including providing a workpiece including gate structures disposed on a substrate, with a gap between the gate structures; filling the gap with a flowable dielectric material; and partially densifying the flowable dielectric material to form a dual density filled gap including a lower density dielectric fill region capped by a higher density dielectric fill region. The method may involve performing subsequent processing operations such as chemical mechanical planarization and/or contact etch on the substrate. In certain embodiments these operations involve removal of a portion of the dielectric fill material. In an example, hole is etched within the filled gap expose an underlying contact, such that sidewalls of the hole include exposed dielectric fill material. The method then may involve densifying at least a portion of the exposed dielectric fill material and/or depositing a liner on at least a portion of the exposed dielectric fill material.

Filling the gap with a flowable dielectric material involves exposing the substrate to process gases under conditions such that a flowable film forms and fills the gap. The film may form within the gap and/or form on field regions of the substrate and flow into the gap according to various reaction mechanisms. In certain embodiments, the processes gases include a silicon-containing precursor and an oxidant, and optionally a dopant such as a carbon, nitrogen or silicon dopant. In certain process gases further include a surfactant, one example of which is a solvent. In certain embodiments process gases further include a catalyst. According to various embodiments, the flowable dielectric material is a silicon nitride material, a silicon oxynitride material or a silicon oxide material. The gap may be filled using a single cycle deposition in certain embodiments.

Partially densifying the flowable dielectric material may involve various techniques such as exposing it to an inert, nitriding and/or oxidizing plasma, and exposing it to an oxidant in the presence of ultraviolet radiation or elevated temperature. Partially densifying the flowable dielectric material may involve removing at least one of hydrogen (—H), hydroxyl (—OH), alkyl (—CH) or amine (—NH) groups from the flowable dielectric material. Partially densifying the flowable dielectric material may further involve forming Si—O—Si linkages.

In certain embodiments, partially densifying the material involves densifying without chemically converting the flowable dielectric material. Converting the flowable dielectric material, e.g., to an oxide, may be performed in a separate operation or not at all.

Another aspect relates to a method for filling a gap including providing a workpiece including a gap; filling the gap with a flowable dielectric material; performing a first treatment on the dielectric material in the gap; after exposing the dielectric material to the first treatment, removing a portion of the dielectric material in the gap to create a hole including one or more sidewalls; and after removing the portion of the dielectric material, performing a second treatment on the dielectric material in the gap. Performing the first treatment may involve partially densifying the flowable dielectric material to form a dual density filled gap comprising a lower density dielectric fill region capped by a higher density dielectric fill region. Removing a portion of the dielectric material may involve etching the dual density filled gap to expose a portion of the lower density dielectric fill region. Performing the second treatment may involve treating the exposed portion of the lower density dielectric fill region. Treating the exposed portion comprises densifying the exposed dielectric fill material. Treating the exposed portion comprises depositing a liner thereon. After performing the second treatment, in certain embodiments, the method involves exposing the treated dielectric material to a wet etchant. According to various embodiments, at least one of the first and second treatments involves exposing the dielectric material to an oxidant in the presence of ultraviolet radiation.

These and other aspects of the invention are described more fully below with reference to the drawings.

DETAILED DESCRIPTION OF THE INVENTION

Introduction

Figure 1A:
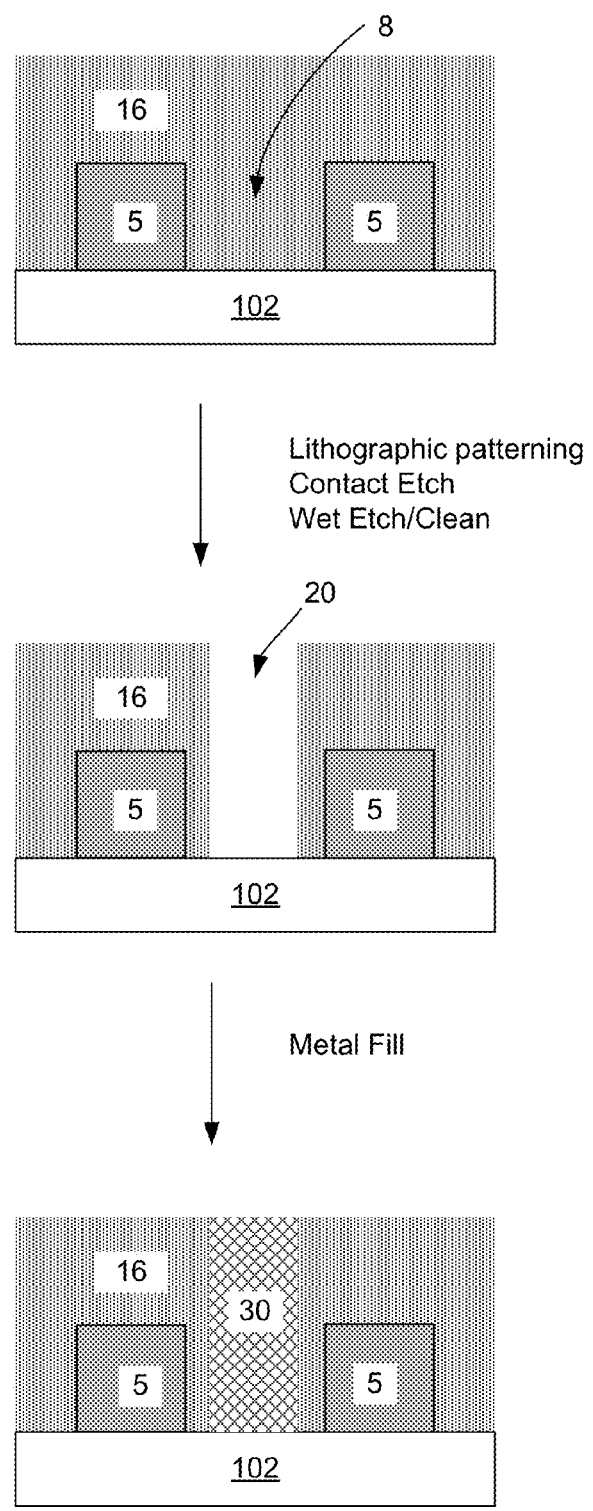
FIG. 1A is a schematic depiction of a contact etch process according to certain embodiments.

The present invention pertains to methods of filling gaps on a substrate. In certain embodiments, the methods pertain to filling high aspect (AR) ratio (typically at least 6:1, for example 7:1 or higher), narrow width (e.g., sub-50 nm) gaps. In certain embodiments, the methods pertain filling both low AR gaps (e.g., wide trenches). Also in certain embodiments, gaps of varying AR may be on the substrate, with the embodiments directed at filling low and high AR gaps.

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

In a particular example, a PMD layer is provided between the device level and the first layer of metal in the interconnect level of a partially fabricated integrated circuit. The methods described herein include dielectric deposition in which gaps, (e.g., the gaps between gate conductor stacks) are filled with dielectric material.

The methods described herein involve deposition of flowable dielectric films. While the description below refers chiefly to flowable silicon oxide films, the integration schemes described herein may also be used with other types of flowable dielectric films. For example, the film as-deposited may be primarily silicon nitride, with Si—N and N—H bonds.

As used herein, the term "flowable oxide film" is a flowable doped or undoped silicon oxide film having flow characteristics that provide consistent fill of a gap. The flowable oxide film may also be described as a soft jelly-like film, a gel having liquid flow characteristics, a liquid film, or a flowable film. In certain embodiments, forming a flowable film involves reacting a silicon-containing precursor and an oxidant to form a condensed flowable film on the substrate. Formation of the film may be aided by a catalyst, e.g., as described in U.S. patent application Ser. No. 11/925,514, filed Oct. 26, 2007, incorporated by reference herein. The flowable oxide deposition methods described herein are not limited to a particular reaction mechanism, e.g., the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The substrate is exposed to the process gases for a period sufficient to deposit a flowable film to fill at some of the gap. The deposition process typically forms soft jelly-like film with good flow characteristics, providing consistent fill. In certain embodiments, the flowable film is an organo-silicon film, e.g., an amorphous organo-silicon film. In other embodiments, the flowable oxide film may have substantially no organic material.

According to various embodiments, the processes may also involve deposition of solid oxide films, e.g., HDP oxide films and TEOS oxide films, e.g., as planar dielectric layers. As deposited HDP oxide films and TEOS oxide films are solid and not flowable, whereas as-deposited flowable oxide films are not initially solid. The term "flowable oxide film" may be used herein to refer to flowable oxide films that have undergone a densification or cure process that wholly or partially solidifies as well as-deposited flowable oxide films. Details of flowable oxide deposition processes are described further below.

Integration Processes

As indicated above, the gap fill methods described herein may be used in integration schemes in which gap fill material undergoes various post-deposition processing such as CMP, dry etch and wet etch. FIG. 1A includes a cross-sectional schematic depiction of two structures 5 and a dielectric layer 16 on a substrate 102, according to certain embodiments. Structures 5 may be silicon or metal transistor gates, for example, of a partially fabricated integrated circuited with substrate 102a semiconductor including source and drain doped regions, etc. As depicted, lithography and etch operations are performed to form a hole 20 in dielectric layer 16. After being formed, the hole 20 may be filled with tungsten or another metal 30. During the contact etch process, the dielectric layer 16 is exposed to various etch chemistries. In some embodiments, this includes a reaction ion etch (RIE) or plasma etch, followed by a wet etch or clean. Example wet etch or clean chemistries include hydrogen fluoride-based, ammonia-based, hydroxide-based including ammonia hydroxide-based, peroxide-based and sulfur-based chemistries. If the dielectric material in the gap is not uniformly etched, an undesirable re-entrant structure could form or voids or other defects may develop in dielectric layer 16. Embodiments described herein provide methods of filling gaps between structures with dielectric material. Gap fill material 8 is shown in FIG. 1A. According to various embodiments, the methods described herein provide consistent void-free fill in a gap, with the dielectric fill material uniformly etched by the dry and/or wet etch processes. In certain embodiments, single cycle (deposition-cure) methods for filling gaps are provided.

Figure 1B:
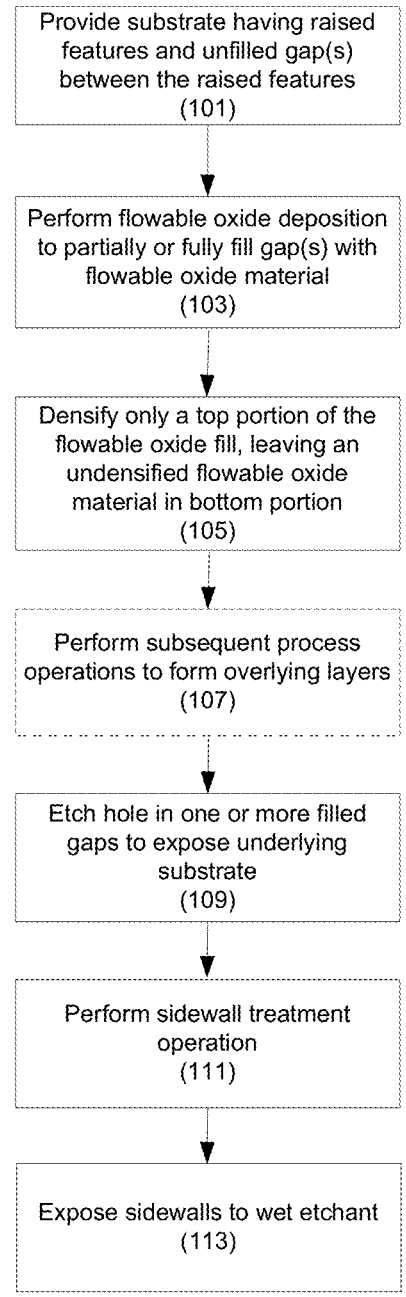
FIGS. 1B-1D are process flow diagrams illustrating operations in semiconductor processing methods according to certain embodiments.
Figure 1C:
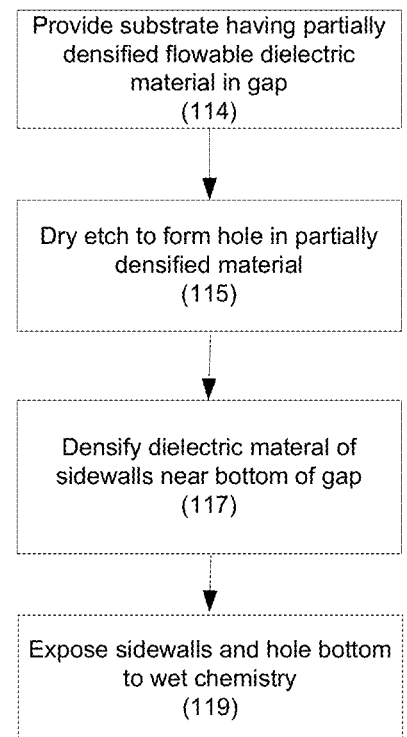

FIGS. 1B and 1C are flow diagrams illustrating certain operations in methods according to various embodiments. Turning first to FIG. 1B, a method begins by providing a substrate having one or more raised features and unfilled gaps between those features. (Block 101). An example is a gap between two gate structures at the device level of a partially fabricated integrated circuit. Typically, the gaps are narrow, having critical dimensions on the order of about 1-50 nm, in some cases between about 2-30 nm or 4-20 nm, e.g. 13 nm. This refers to the width of the gap opening at its narrowest point. The methods are not necessarily limited to these ranges, but can be used with smaller or larger gaps as well. In certain embodiments, one or more of the gaps on the substrate is re-entrant, i.e., the sidewalls of the gap narrow from the bottom of the gap towards the gap opening.

The method continues by performing a flowable oxide deposition operation to partially or wholly fill the gaps. (Block 103). As indicated above, flowable oxide provides consistent fill. As discussed further below, flowable oxide deposition may include one or more pre-treatment operations. In certain embodiments, the gap is filled using a single flowable oxide deposition cycle. In other embodiments, multiple deposition cycles may be employed.

Next, the as-deposited flowable oxide material is exposed to a post-deposition treatment densification operation to partially densify the material in the gaps. (Block 105). In certain embodiments, this operation involves exposing the as-deposited flowable oxide material to an oxidizing and/or nitridizing plasma. Operations 103 and 105 are performed such that only a top portion of the deposited film in the gap is densified, leaving a low-density material remaining at the bottom of the gap. After partial densification of the fill material, one or more additional layers are optionally formed on the substrate. (Block 107). For example, in certain embodiments, another dielectric layer is formed over the filled gap, e.g., by a flowable oxide or TEOS oxide deposition process. This may or may not take place after various other operations, such as formation of structures, CMP, etc. In a subsequent operation, a hole, e.g., a contact hole, is formed in the gap fill material to expose a surface of the underlying substrate. (Block 109). The remaining gap fill material, including the densified and undensified portions, forms at least part of the sidewalls of the hole. A sidewall treatment operation is then performed (Block 111). According to various embodiments, this may be additional densification operation to densify low density portions of the flowable oxide gap fill material that were exposed by the etch operation 109 and/or deposition of a liner material on at least a portion of the sidewalls. Treatment operations are discussed further below. The structure is then exposed to a wet etch chemistry, e.g., to a peroxide-containing chemistry, a halogen-containing chemistry, a sulfur-containing chemistry, or another other appropriate wet etch chemistry (Block 113). The wet etch chemistry may be performed to clean the contact. In alternate embodiments, the process flow described in FIG. 1B may take place without operation 105 or with a full densification operation in lieu of operation 105. In some embodiments, a strip operation can be performed prior to block 113. For example, a strip operation can be performed after block 111 and prior to block 113. A strip process can involve exposing the structure to a plasma, e.g., an oxygen-containing or hydrogen-containing plasma, to remove photoresist and etch-related residue. In some embodiments, the treatment may be performed as part of block 109 or as part of a strip process. For example, a contact plasma dry etch may be performed with an operation added to the dry etch to densify the sidewalls. In another example, a typical strip operation may be performed with an operation added to densify the sidewalls.

FIG. 1C is a flow diagram showing an embodiment of the process described in FIG. 1B. First, in an operation 114, a partially densified flowable dielectric material is provided in a gap. This may be done as described about with respect to operations 103 and 105, above. As discussed above with respect to FIG. 1A, there may be additional material formed on top of the filled gap. A dry etch is then performed to etch a hole in the filled gap. (Block 115). The dry etch may involve exposing the dielectric material to fluorine-based plasma, e.g., a $CF_4$, $CH_2F_2$, $C_3F_8$, $C_2F_6$, $C_4F_8$, $NF_3$, $F_2$ and the like. These etch chemistries are provided as examples; other dry etch chemistries may be used as well. The etch operation may be preceded by forming an etch mask by lithography or other technique. In certain embodiments, the dry etch results in a hole having substantially straight sidewalls; that is, the etch rates of the high and low density portions of the gap are about equal, and are about equal to the etch rate of any overlying dielectric material as well. A strip operation may be performed at this time. A densification operation is then performed to densify portions of the sidewalls proximate to the bottom of the gap. (Block 117). This may involve exposing these portions of the sidewalls to an oxidizing and/or nitridizing plasma, a thermal anneal or other appropriate densification process. The substrate is then exposed to a wet chemistry, e.g., hydrofluoric acid, hydrochloric acid, a peroxide, sulfuric acid, etc., which may be used to clean the contact. (Block 119).

Figure 1D:
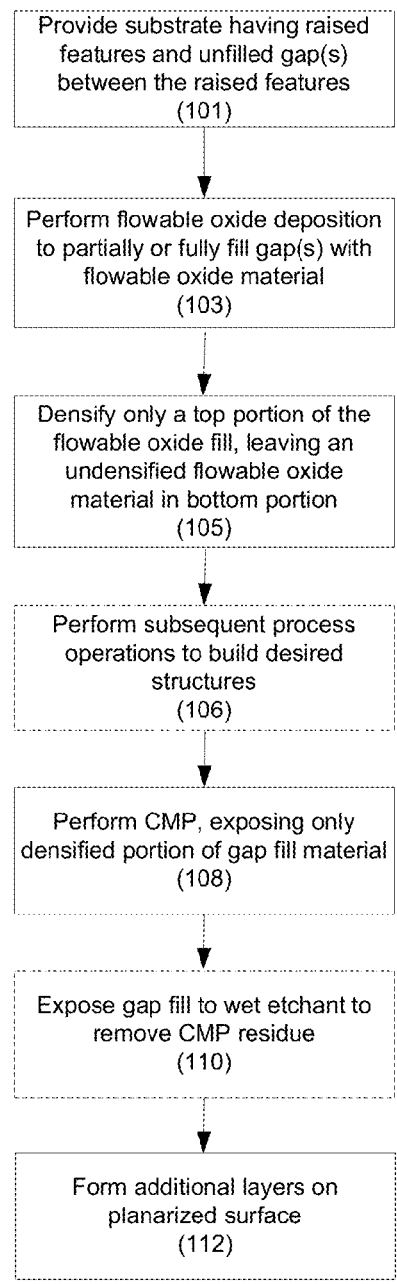

FIG. 1D is a flow diagram according to another embodiment. In this embodiment, operations 101-105 are performed as described above with respect to FIG. 1B. In this embodiment, operations 103 and 105 are tailored such that the top densified portion is sufficient to protect the low-density material in later processing operations, including chemical mechanical planarization (CMP). After partial densification of the gapfill material, if needed, subsequent pre-CMP processing operations are performed as needed for the particular IC fabrication process. (Block 106). These may include, e.g., formation of conductive or insulative structures or layers, patterning operations, etching operations, etc. The resulting layers including, in this embodiment, the gap fill material, are then exposed to CMP. (Block 108). Because the fill height and subsequent densification have been tailored, the CMP line falls within the top densified portion of the gap fill material formed in operation 105. In certain embodiments, CMP residues are removed by exposing the planarized surface to a wet chemical etchant, e.g., hydrochloric acid. (Block 110). Although not depicted in FIG. 1D, in certain embodiments, a post-planarization gap fill treatment operation may be performed prior to exposing the surface to a wet etchant. These are discussed further below. Returning to the figure, additional layers may then be formed on the planarized surface (Block 112).

Figure 2A:
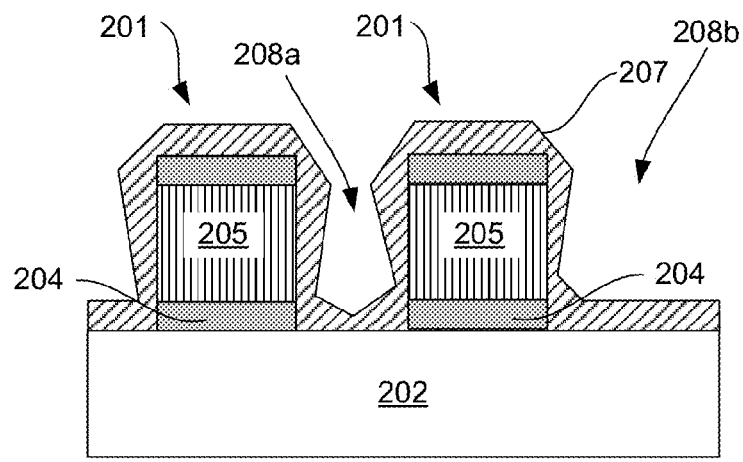
FIGS. 2A-2J are schematic depictions of stages in a pre-metal dielectric (PMD) integration process according to certain embodiments.

According to various embodiments, a single integration process may involve one or more of the process flows described about with reference to FIGS. 1A-1D. FIGS. 2A-2J provide an example of a process that employs various operations according to FIGS. 1A-1D in deposition of a PMD layer. FIGS. 2A-2J are schematics illustrating cross-sectional views of certain operations in such a process. The process illustrated in FIGS. 2A-2J shows various stages in depositing pre-metal dielectric in a "gate-last" gate fabrication process. In a gate-last process, dummy gates are initially formed and take the place of metal gates for various processing operations. Gate-last processes are used to prevent metal gates from exposure to certain processing conditions. In FIG. 2A, dummy gate structures 201 are shown on substrate 202. Substrate 202 is typically a semiconducting substrate such as silicon, gallium arsenide and the like, and may contain n-doped and p-doped regions (not shown). Dummy gate structures 201 include gate dielectric layers 204, which may include a silicon oxide layer and/or a high-k dielectric layer, dummy gates 205, and silicon nitride spacer/barrier material 207. Dummy gates 205 may be polysilicon or other appropriate selectively removable material. Narrow gap 208a is between the dummy gate structures 201; narrow gap 208b is between a gate structure 201 and another structure (not shown). As described further below, a contact hole is eventually formed in gap 208b in the particular process sequence illustrated.

Figure 2B:
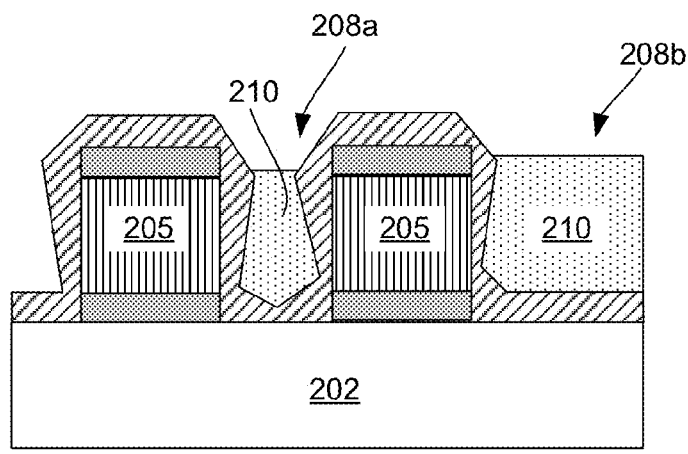

Continuing to FIG. 2B, a flowable dielectric film 210 is formed in gaps 208a and 208b, forming a dielectric gap fill material. Any flowable dielectric formation process may be used, with details of flowable oxide deposition processes according to certain embodiments provided further below. In many embodiments, the deposition is performed in a single step. The flowable oxide film is generally deposited to fill at least the re-entrant portion of the gap, i.e., the portion of the gap where the sidewalls taper inwardly as they extend from the bottom of the gap. Also, in certain embodiments, the flowable dielectric film is deposited such that it is at least at the height of the top of dummy gates 205. In certain embodiments, the flowable oxide film is deposited to the level of the surface of layer 207. As will be explained further below, however, in certain embodiments, care is taken to limit the thickness of the deposited flowable oxide film in the gap to ensure that the film is appropriately densified in the next operation. It should be noted that while some amount of flowable oxide may be deposited in wide gaps, if present, the thickness is negligible due to the gap dimensions. In other embodiments, a thicker layer, or overburden, may be deposited above the height of the top of the dummy gates. In that case the wide gaps may be entirely filled with flowable oxide.

Figure 2C:
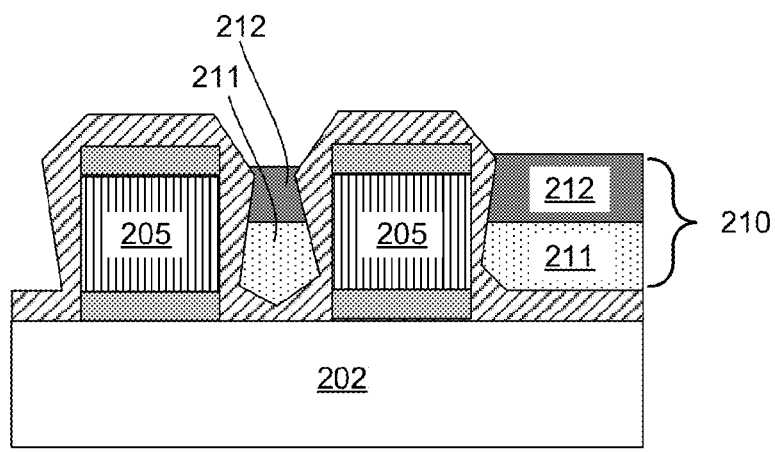

Once deposited, the flowable oxide film is partially densified to form densified top portion 212 and undensified bottom portion 211 of the dielectric gap fill material 210, as shown in FIG. 2C. Portion 212 is a high density film and may be considered solid, while bottom portion 211 has a lower density although still solid. In certain embodiments, densifying the flowable oxide film is performed by exposing it to an oxidizing and/or nitridizing plasma. In certain embodiments, both top portion 212 and bottom portion 211 are oxidized, nitridized or otherwise reacted to form the desired chemical composition of the dielectric gap fill (e.g., SiO, SiN, SiON, SiOC or other desired network). Only a top portion of the film is densified by the plasma cure. The fill height and densification depth are targeted such that only the high density oxide is exposed during subsequent processing operations including chemical mechanical polishing/planarization (CMP). The film may be densified in a single step.

Figure 2D:
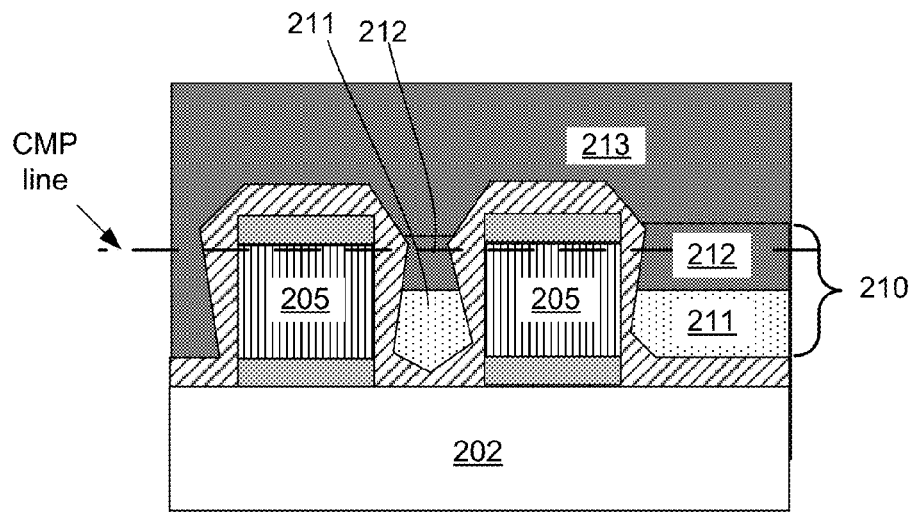

Once the partially densified film including undensified or partially densified bottom portion 211 and densified portion 212 is formed, an overburden dielectric layer 213 is deposited. Overburden dielectric layer 213 may be deposited by any appropriate oxide deposition method including but not limited to flowable oxide deposition, HDP oxide deposition or a TEOS oxide deposited by plasma enhanced chemical vapor deposition (PECVD). Overburden layer 213 is deposited to a thickness sufficient to perform CMP to open the gate structures. See. FIG. 2D.

Figure 2E:
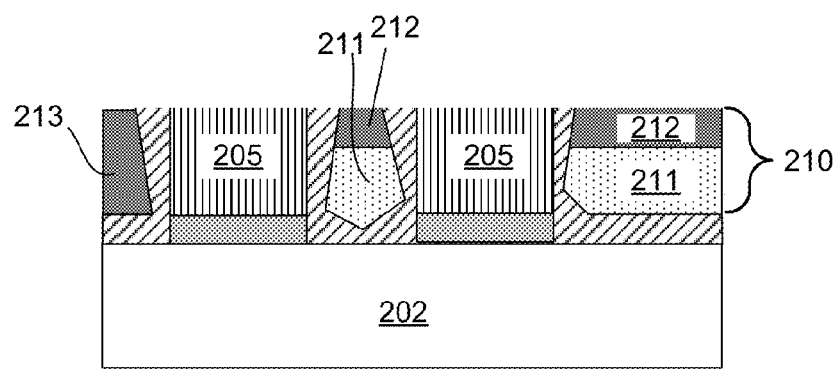
Figure 2F:
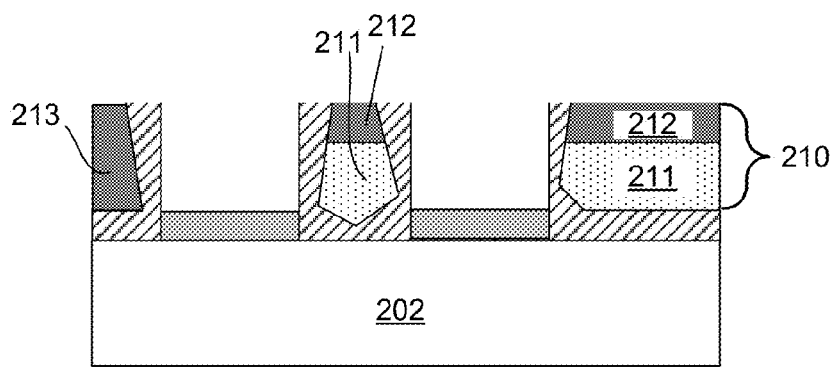

As indicated, a CMP process is then performed to planarize dielectric layer 213 until a top portion of each of dummy gates 205 is exposed. This is shown in FIG. 2E. Of the dielectric material, only the overburden dielectric layer 213 and densified top portion 212 of the gap fill 210 are exposed to CMP; bottom undensified portion 211 is not exposed to CMP but is protected by top portion 212. The CMP process may involve or be followed by exposing the dielectric layer 213 and densified top portion 212 to a wet etchant chemistry such as dilute hydrofluoric acid (DHF) to clean CMP residue. The acid contacts the densified top portion 212. In alternate embodiments, the planarized surface of densified top portion 212 is treated, as described further below, prior to exposure to a wet etchant.

Figure 2G:
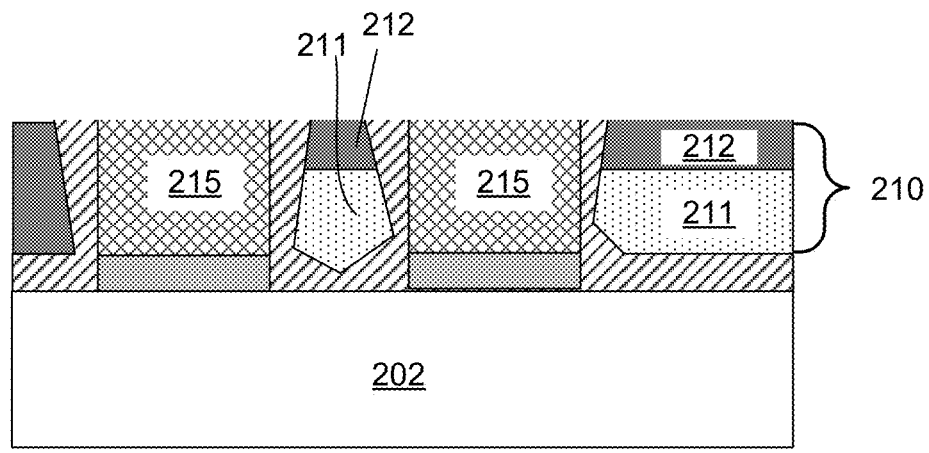
Figure 2H:
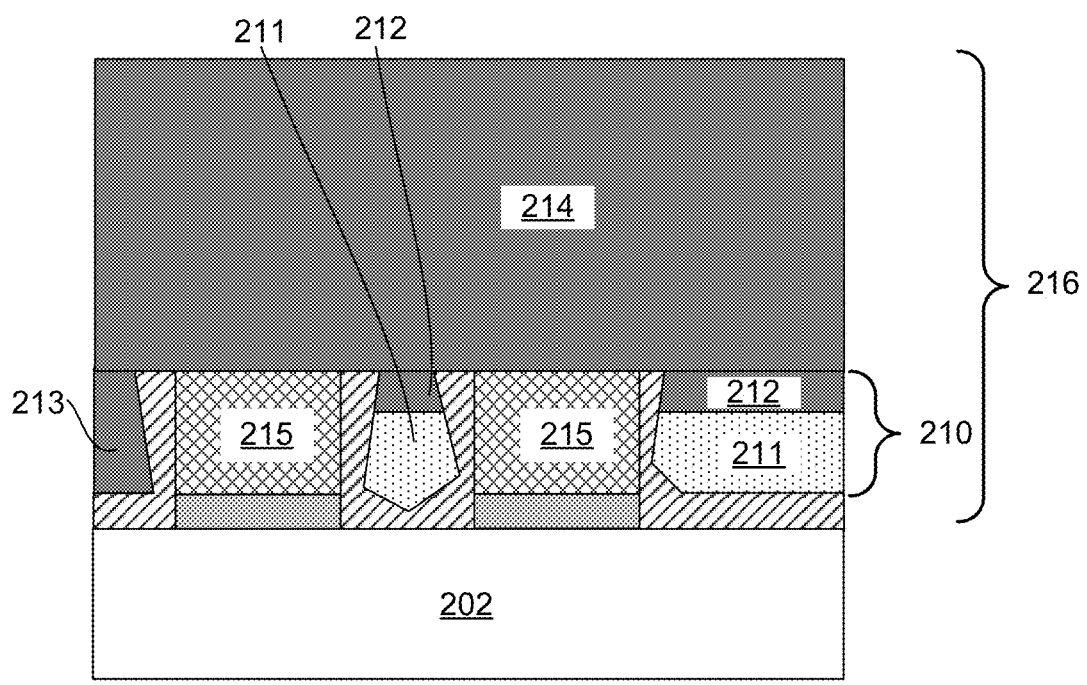

Following the CMP process, dummy gates 205 are removed by selective etching or other appropriate method. See FIG. 2F. Metal gates 215 are then formed in the recess provided by removal of the dummy gates. Metal gates 215 may include liner layers, barrier layers, adhesion layers, etc. (not shown) as well as a fill layer. Any appropriate metal may be used including tungsten, titanium, tantalum, aluminum, and combinations thereof (e.g., TiAl, TAlN, etc.) as well conductive metal nitrides and conductive metal oxides. Forming metal gates 215 may include one or more deposition operations, including atomic layer deposition (ALD), chemical vapor deposition (CVD) or physical vapor deposition (PVD), as well as post-deposition operations such as CMP. FIG. 2G shows metal gates 215.

Figure 2I:
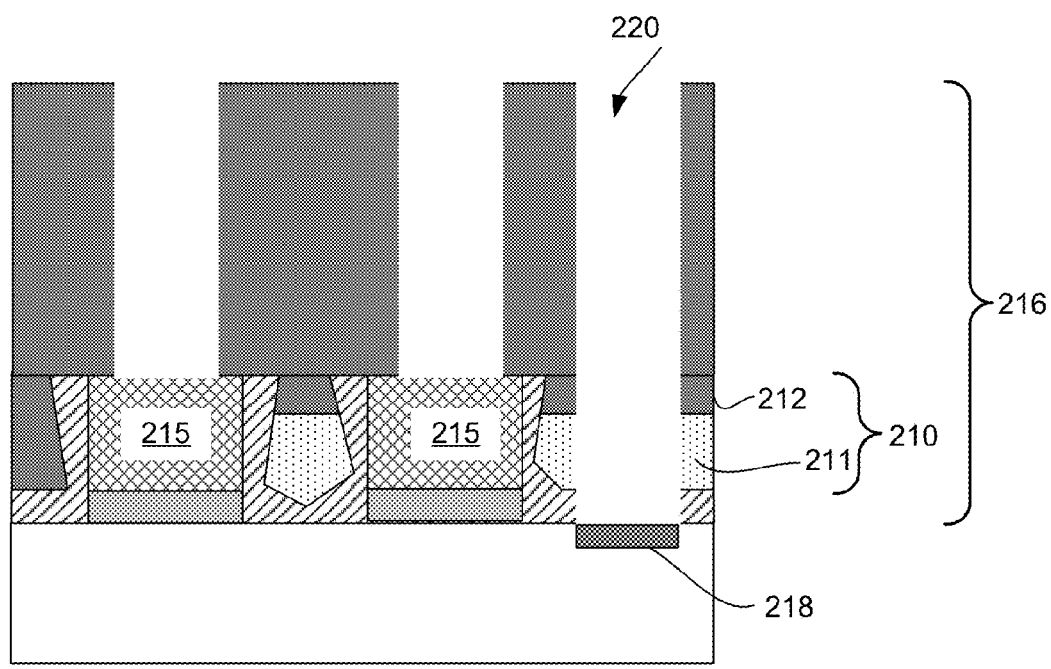
Figure 2J:
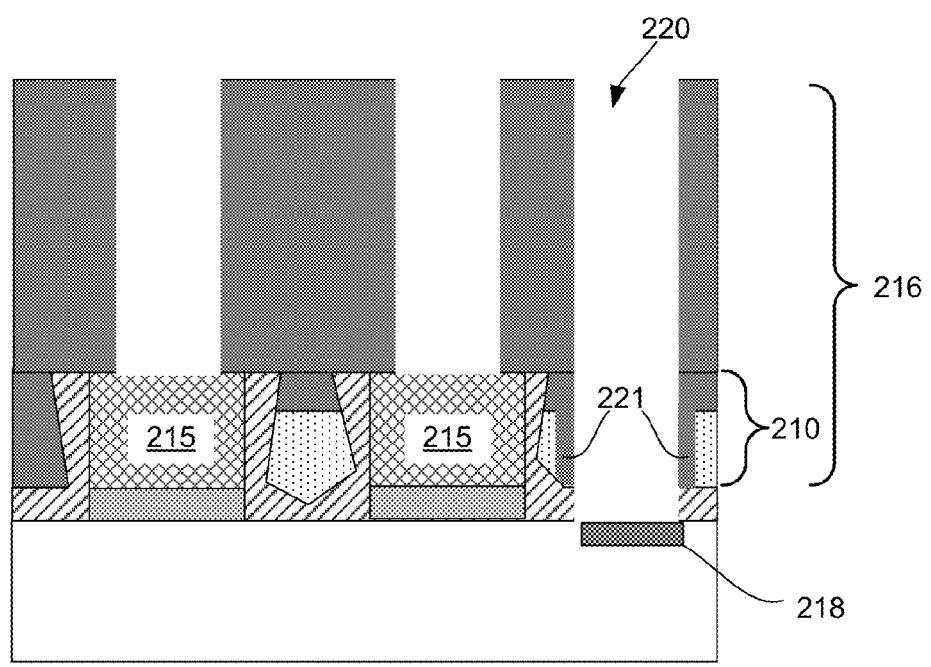

Dielectric layer 214 is then deposited over the metal gates and filled gaps; together with dielectric material 213 and gap fill layer 210 including densified top portion 212 and undensified bottom portion 211, it forms PMD layer 216. See FIG. 2H. Contact etch is then performed to expose gates 215, and contact 218. This is shown in FIG. 2I. (Exposed contact 218 may include a layer of oxide on the metal contact, which may be later cleaned off.) The etch creates a hole 220 in layer 216, with sidewalls of the hole 220 formed from layer 216, including densified portion 212 and undensified portion 211. In certain embodiments, an additional densification operation is performed to densify sidewall portions 221. See FIG. 2J. As indicated above, in certain embodiments, the additional densification operation is performed prior to exposure to a wet chemistry to clean the contact. The etched holes may then be filled with tungsten, copper or other desired conductor.

While FIGS. 2A-2J provide an example of PMD formation in a gate-last process flow according to certain embodiments, the methods may also be used for dielectric fill between gate structures in a gate-first integration process, or more generally, for dielectric fill between any structures or features in an integrated circuit fabrication process. In particular embodiments, the methods provide gap fill techniques for integration schemes involving CMP and/or dry and/or wet etch and/or clean of gap fill material.

Flowable Oxide Deposition

As described above, the gap fill methods according to the embodiments described herein include one or more operations in which the gap is partially or wholly filled with a flowable dielectric film. In many embodiments, the flowable dielectric film is a flowable silicon and oxygen-containing film, though the integration schemes described herein can also be implemented with other flowable dielectric films. According to various embodiments, the flowable film is formed by a spin-on glass technique. In alternate embodiments, the flowable film is formed by introducing vapor phase reactants to a deposition chamber at conditions such that a flowable film is formed on the substrate to fill the gap.

Figure 3:
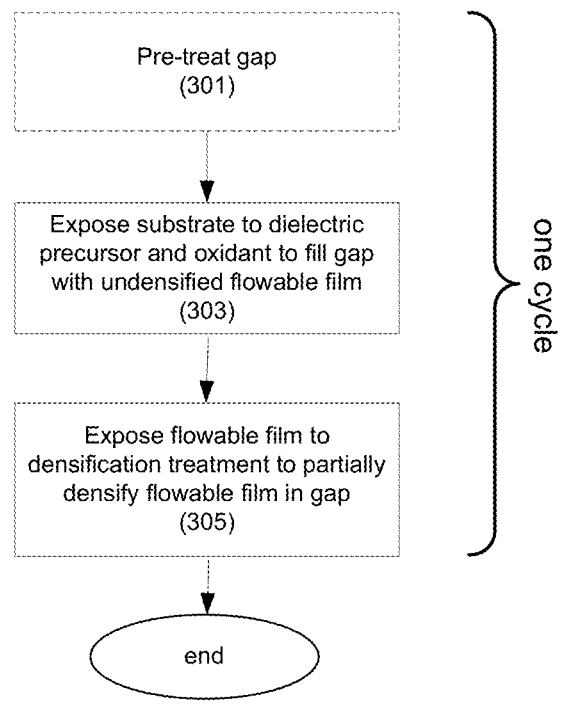
FIG. 3 is a process flow diagram illustrating operations in a method of filling trenches or other gaps with dielectric material according to certain embodiments.

FIG. 3 provides certain operations in a method of filling a gap with a flowable oxide material according to certain embodiments. The process typically begins prior to any oxide material being deposited in the gap, with the gap defined by sidewall and bottom surfaces. The sidewall and bottom surfaces may be silicon nitride, silicon oxide, silicon oxynitride, or other silicon-containing materials.

At 301, an optional pretreatment operation is performed. According to various embodiments, a pretreatment operation involves exposure to a plasma containing oxygen, nitrogen, helium or some combination of these. The plasma may be downstream or in-situ, generated by a remote plasma generator, such as an Astron® remote plasma source, an inductively-coupled plasma generator or a capacitively-coupled plasma generator. Examples of pre-treatment gases include $O_2$, $O_3$, $H_2O$, NO, $NO_2$, $N_2O$, $H_2$, $N_2$, He, Ar, and combinations thereof, either alone or in combination with other compounds. Examples of chemistries include $O_2$, $O_2/N_2$, $O_2/He$, $O_2/Ar$, $O_2/H_2$ and $H2/He$. The particular process conditions may vary depending on the implementation. In alternate embodiments, the pretreatment operation involves exposing the substrate to $O_2$, $O_2/N_2$, $O_2/He$, $O_2/Ar$ or other pretreatment chemistries, in a non-plasma environment. The particular process conditions may vary depending on the implementation. In these embodiments, the substrate may be exposed to the pretreatment chemistry in the presence energy from another energy source, including a thermal energy source, a ultra-violet source, a microwave source, etc. In certain embodiments, in addition to or instead of the pretreatment operations described above, a substrate is pretreated with exposure to a catalyst, surfactant, or adhesion-promoting chemical. The pre-treatment operation, if performed, may occur in the deposition chamber or may occur in another chamber prior to transfer of the substrate to the deposition chamber. Once in the deposition chamber, and after the optional pre-treatment operation, process gases are introduced.

Deposition Chemistries

For forming silicon oxides, the process gas reactants generally include a silicon-containing compound and an oxidant, and may also include a catalyst, a solvent (and/or other surfactant) and other additives. The gases may also include one or more dopant precursors, e.g., a carbon, fluorine, phosphorous and/or boron-containing gas. Sometimes, though not necessarily, an inert carrier gas is present. In certain embodiments, the gases are introduced using a liquid injection system. In certain embodiments, the silicon-containing compound and the oxidant are introduced via separate inlets or are combined just prior to introduction into the reactor in a mixing bowl and/or showerhead. The catalyst and/or optional dopant may be incorporated into one of the reactants, pre-mixed with one of the reactants or introduced as a separate reactant. The substrate is then exposed to the process gases at an operation 303. Conditions in the reactor are such that the silicon-containing compound and the oxidant react to form a condensed flowable film on the substrate. Formation of the film may be aided by presence of a catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. The substrate is exposed to the process gases for a period sufficient to deposit a flowable film to fill at least some of the gap or overfill the gap as desired.

In certain embodiments, the silicon-containing precursor is an alkoxysilane. Alkoxysilanes that may be used include, but are not limited to, the following:

$H_x$—Si—$(OR)_y$ where x=0-3, x+y=4 and R is a substituted or unsubstituted alkyl group;

$R'_x$—Si—$(OR)_y$ where x=0-3, x+y=4, R is a substituted or unsubstituted alkyl group and R' is a substituted or unsubstituted alkyl, alkoxy or alkoxyalkane group; and $H_x(RO)_y$—Si—Si—$(OR)_y H_x$ where x=0-2, x+y=3 and R is a substituted or unsubstituted alkyl group.

Examples of silicon containing precursors include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), tetraisocyanatesilane (TICS), bis-tert-butylamino silane (BTBAS), hydrogen silsesquioxane, tert-butoxydisilane, T8-hydridospherosiloxane, OctaHydro POSS™ (Polyhedral Oligomeric Silsesquioxane) and 1,2-dimethoxy-1,1,2,2-tetramethyldisilane. Further examples of silicon containing precursors include, but are not limited to, silane ($SiH_4$), disilane, trisilane, hexasilane, cyclohexasilane, and alkylsilanes, e.g., methylsilane, and ethylsilane.

In certain embodiments, carbon-doped precursors are used, either in addition to another precursor (e.g., as a dopant) or alone. Carbon-doped precursors include at least one Si—C bond. Carbon-doped precursors that may be used include, but are not limited to, the following:

$R'_x$—Si—$R_y$ where x=0-3, x+y=4, R is a substituted or unsubstituted alkyl group and R' is a substituted or unsubstituted alkyl, alkoxy or alkoxyalkane group; and $SiH_x R'_y$—$R_z$ where x=1-3, y=0-2, x+y+z=4, R is a substituted or unsubstituted alkyl group and R' is a substituted or unsubstituted alkyl, alkoxy or alkoxyalkane group.

Examples of carbon-doped precursors are given above with further examples including, but not being limited to, trimethylsilane (3MS), tetramethylsilane (4MS), diethoxymethylsilane (DEMS), dimethyldimethoxysilane (DMDMOS), methyl-triethoxysilane (MTES), methyl-trimethoxysilane, methyl-diethoxysilane, methyl-dimethoxysilane, trimethoxymethylsilane, (TMOMS), dimethoxymethylsilane, and bis(trimethylsilyl)carbodiimide.

In certain embodiments aminosilane precursors are used. Aminosilane precursors include, but are not limited to, the following:

$H_x$—Si—$(NR)_y$ where x=0-3, x+y=4 and R is an organic of hydride group.

Examples of aminosilane precursors are given above, with further examples including, but not being limited to -tert-butylamino silane (BTBAS) or tris(dimethylamino)silane.

Examples of suitable oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). In certain embodiments, a remote plasma generator may supply activated oxidant species.

One or more dopant precursors, catalysts, inhibitors, buffers, surfactants, solvents and other compounds may be introduced. In certain embodiments, a proton donor catalyst is employed. Examples of proton donor catalysts include 1) acids including nitric, hydrofluoric, phosphoric, sulphuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_xX_yH_z$ where x=1-2, y=1-3, z=1-3 and X is a halide; 4) $R_xSi$—$X_y$, where x=1-3 and y=1-3; R is alkyl, aloxy, aloxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated molecules, including halogenated organic molecules, such as dichlorosilane ($SiCl_2H_2$), trichlorosilane ($SiCl_3H$), methylchlorosilane ($SiCH_3ClH_2$), chlorotriethoxysilane, chlorotrimethoxysilane, chloromethyldiethoxysilane, chloromethyldimethoxysilane, vinyltrichlorosilane, diethoxydichlorosilane, and hexachlorodisiloxane. Acids which may be used may be mineral acids such as hydrochloric acid (HCl), sulphruic acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chloro-diethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCl_2CO_2H$), oxalic acid ($HO_2CCO_2H$), benzoic acid ($C_6H_5CO_2H$), and triethylamine.

According to various embodiments, catalysts and other reactants may be introduced simultaneously or in particular sequences. For example, in some embodiments, a acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Some examples of catalysts are given above. Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane. Methods of rapid delivery that may be employed are described in U.S. application Ser. No. 12/566,085, incorporated by reference herein.

Surfactants may be used to relieve surface tension and increase wetting of reactants on the substrate surface. They may also increase the miscibility of the dielectric precursor with the other reactants, especially when condensed in the liquid phase. Examples of surfactants include solvents, alcohols, ethylene glycol and polyethylene glycol. Difference surfactants may be used for carbon-doped silicon precursors because the carbon-containing moiety often makes the precursor more hydrophobic.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

As indicated above, any of the reactants (silicon-containing precursor, oxidant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off.

Reactions conditions are such that the silicon-containing compound and oxidant, undergo a condensation reaction, condensing on the substrate surface to form a flowable film. In certain embodiments, the reaction takes place in dark or non-plasma conditions. In other embodiments, the reaction takes place in the presence of a plasma, generated either remotely or in the deposition chamber. Methods of depositing a flowable film for gap fill via a plasma-enhanced chemical vapor deposition (PECVD) reaction are described in U.S. patent application Ser. No. 12/334,726, incorporated by reference herein.

Chamber pressure may be between about 1-200 Torr, in certain embodiments, it is between 10 and 75 Ton. In a particular embodiment, chamber pressure is about 10 Torr.

Partial pressures of the process gas components may be characterized in terms of component vapor pressure and range as follows, with Pp the partial pressure of the reactant and Pvp the vapor pressure of the reactant at the reaction temperature.

Precursor partial pressure ratio (Pp/Pvp)=0.01-1, e.g., 0.01-0.5
Oxidant partial pressure ratio (Pp/Pvp)=0.25-2, e.g., 0.5-1
Solvent partial pressure ratio (Pp/Pvp)=0-1, e.g, 0.1-1

In certain embodiments, the process gas is characterized by having a precursor partial pressure ratio is 0.01 and 0.5, an oxidant partial ratio between 0.5 and 1, and a solvent (if present) partial pressure ratio between 0.1 and 1. In the same or other embodiments, the process gas is characterized by the following:

Oxidant: Precursor partial pressure ratio ($P_{P_{oxidant}}/P_{P_{precursor}}$)=0.2-30, e.g., 5-15

Solvent: Oxidant partial pressure ratio ($P_{P_{solvent}}/P_{P_{oxidant}}$)=0-30, e.g., 0.1-5

In certain embodiments, the process gas is characterized by an oxidant: precursor partial pressure ratio of between about 5 and 15 and a solvent:oxidant partial pressure ration of between about 0.1 and 5.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may require increased pressure. In one embodiment, the temperature is about 5° C. and the pressure about 10 Torr. Exposure time depends on reaction conditions as well as the desired film thickness. Deposition rates are from about 100 angstroms/min to 1 micrometer/min according to various embodiments. In certain embodiments, deposition time is 0.1-180 seconds, e.g., 1-90 seconds.

The substrate is exposed to the reactants under these conditions for a period long enough to deposit a flowable film in the gap. In the depicted embodiment, the entire desired thickness of film is deposited in operation 303, as it is a single cycle deposition. In other embodiments which employ multiple deposition operations, only a portion of the desired film thickness is deposited in a particular cycle. In certain embodiments, the substrate is continuously exposed to the reactants during operation 303, though in other embodiments, one or more of the reactants may be pulsed or otherwise intermittently introduced. Also as noted above, in certain embodiments, one or more of the reactants including a dielectric precursor, oxidant, catalyst or solvent, may be introduced prior to introduction of the remaining reactants.

Next, the flowable film is exposed to a densification treatment to partially densify the flowable film in the gap (Block 305). This may be done in situ, in the deposition chamber, in another chamber. The post-deposition densification treatment operation may involve one or more operations, any or all of which may also result in chemically converting the as-deposited film. In other embodiments, any or all of the densification operations may densify without chemical conversion. In certain embodiments, one conversion operation may be separately performed, or not performed at all. If separately performed, a conversion operation may be performed before or after a densification operation. In one example, a film is converted and partially densified by exposure to a reactive plasma followed by further densification by thermal anneal in an inert environment.

According to various embodiments, the film may be densified by purely thermal anneal, exposure to a downstream or direct plasma, exposure to ultraviolet or microwave radiation or exposure to another energy source. Thermal anneal temperatures may be 300 C. or greater (depending on thermal budget). The treatment may be performed in an inert environment (Ar, He, etc.) or in a potentially reactive environment. Oxidizing environments (using $O_2$, $N_2O$, $O_3$, $H_2O$, $H_2O_2$, NO, $NO_2$, CO, $CO_2$ etc.) may be used, though in certain situation nitrogen-containing compounds will be avoided to prevent incorporation of nitrogen in the film. In other embodiments, nitridizing environments (using $N_2$, $N_2O$, $NH_3$, NO, $NO_2$ etc.) are used. In some embodiments, a mix of oxidizing and nitridizing environments are used. Carbon-containing chemistries may be used to incorporate some amount of carbon into the deposited film. According to various embodiments, the composition of the densified film depends on the as-deposited film composition and the treatment chemistry. For example, in certain embodiments, an Si(OH)x as-deposited gel is converted to a SiO network using an oxidizing plasma cure. In other embodiments, a Si(OH)x as-deposited gel is converted to a SiON network In other embodiments, an Si(NH)x as-deposited gel is converted to an SION network.

In certain embodiments, the film is treated by exposure to a plasma, either remote or direct (inductive or capacitive). This may result in a top-down conversion of the flowable film to a densified solid film. The plasma may be inert or reactive. Helium and argon plasma are examples of inert plasmas; oxygen and steam plasmas are examples of oxidizing plasmas (used for example, to remove carbon as desired). Hydrogen plasmas may also be used. Temperatures during plasma exposure are typically about 100° C. or higher. In certain embodiments, an oxygen or oxygen-containing plasma is used to remove carbon.

Temperatures may range from 0-600° C., with the upper end of the temperature range determined by the thermal budget at the particular processing stage. For example, in certain embodiments, the entire process shown in FIG. 3 is carried out at temperatures less than about 400° C. This temperature regime is compatible with NiSi contacts. In certain embodiments, the temperatures range from about 200° C.-550° C. Pressures may be from 0.1-10 Torr, with high oxidant pressures used for removing carbon.

Other annealing processes, including rapid thermal processing (RTP) may also be used to solidify and shrink the film. If using an ex situ process, higher temperatures and other sources of energy may be employed. Ex situ treatments include high temperature anneals (700-1000° C.) in an environment such as $N_2$, $O_2$, $H_2O$, Ar and He. In certain embodiments, an ex situ treatment involves exposing the film to ultra-violet radiation, e.g., in a ultraviolet thermal processing (UVTP) process. For example, temperatures of 400° C. or above in conjunction with UV exposure may be used to cure the film. Other flash curing processes, including RTP or laser anneal, may be used for the ex situ treatment as well.

Figure 6:
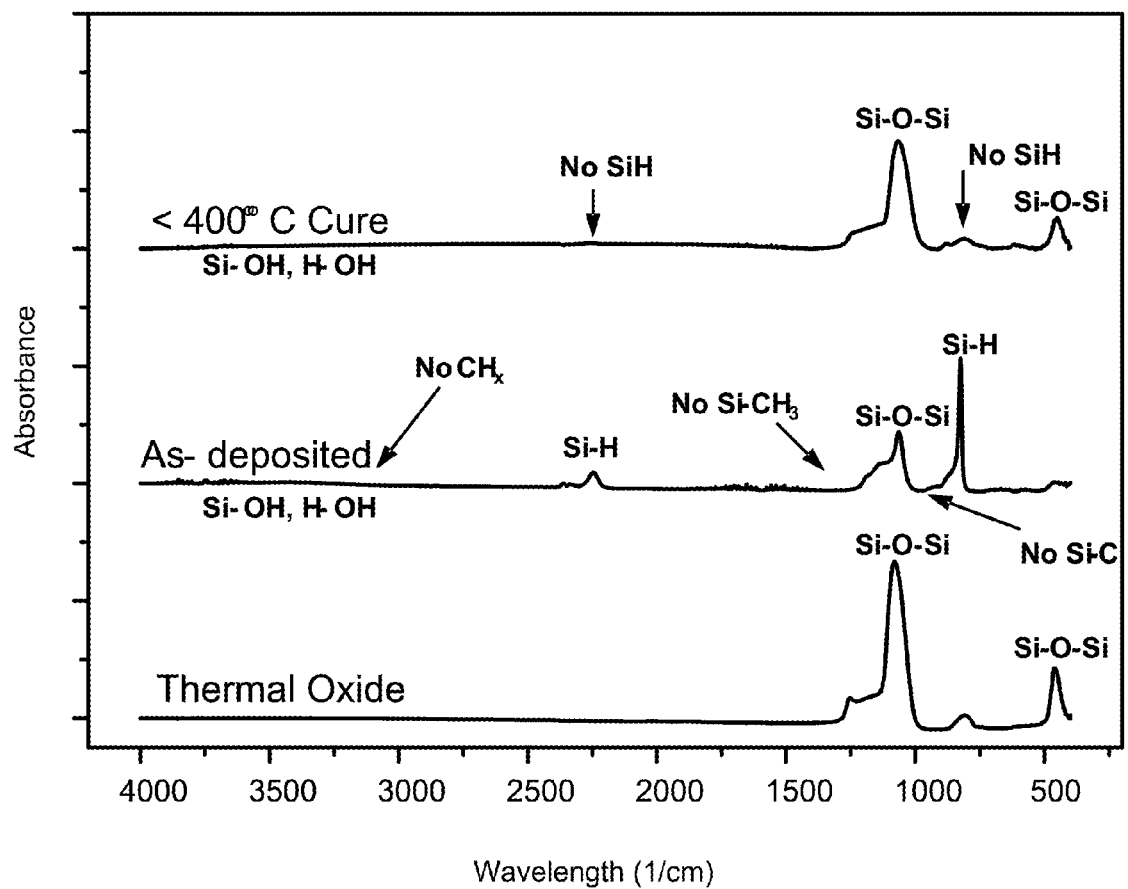
FIG. 6 shows FTIR spectra for thermal oxide and as-deposited and cured flowable oxide films according to certain embodiments.

FIG. 6 shows FTIR spectra of an as-deposited flowable oxide film, a cured (converted) flowable oxide film, and a thermal oxide film. An oxygen plasma cure at less than 400° C. was used. Comparing the as-deposited and cured film, the former includes Si—H bonds, whereas the latter has substantially no Si—H bonds. In the embodiment depicted, the substantially no carbon is present in either the as-deposited or cured films. The Si—O—Si network of the cured film is increased as compared to that of the as-deposited film. It should be noted that in other embodiments, a substantial amount of carbon may remain in the cured film.

Figure 4A:
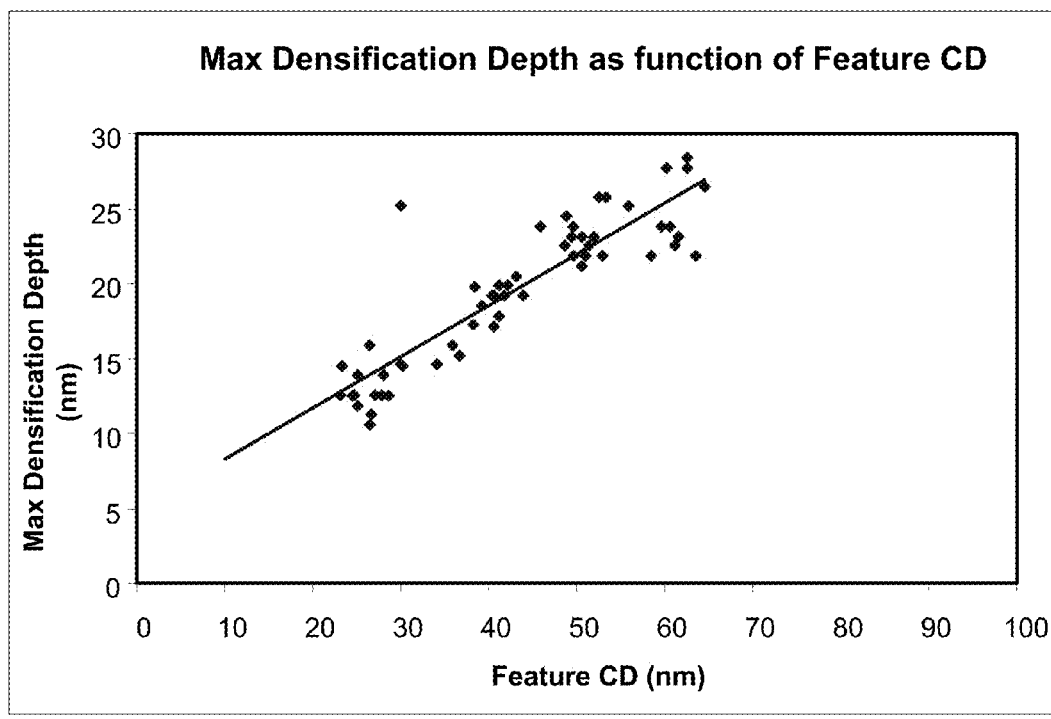
FIG. 4A is graph plotting max densification depth as a function of feature critical dimension.

As indicated above, the densification operation in operation 305 is carried out to densify only a top portion of the flowable dielectric material in the gap, leaving a bottom portion undensified. In certain embodiments, the thickness of the top portion is determined by the maximum densification depth. The maximum densification depth in a patterned gap is the depth to which full densification occurs. It can be limited by film shrinkage and dimensional constraints. In certain embodiments, the maximum densification depth is a function of the critical dimension of the trench or other gap. FIG. 4A is a plot of maximum densification depth as a function of feature critical dimension for an oxidizing plasma cure. Accordingly, in certain embodiments, operation 303 involves depositing gap fill material that exceeds the maximum densification depth, with operation 305 forming a top densified portion that is equal to or less than the maximum densification depth. The material below the densified layer is a lower density oxide.

As indicated above, the flowable dielectric deposition may involve various reaction mechanisms depending on the specific implementation. Examples of reaction mechanisms in a method of depositing a flowable oxide film according to certain embodiments are described below. It should be noted that while these reaction steps provide a useful framework for describing various aspects of the invention, the methods described herein are not necessarily limited to a particular reaction mechanism. The overall deposition process may be described in context of two steps: hydrolysis and condensation. The first step involves hydrolysis of silicon-containing precursors by the oxidant. For example, alkoxy groups (—OR) of the silicon containing precursor may be replaced with hydroxyl groups (—OH). The —OH groups and the residual alkoxy groups participate in condensation reactions that lead to the release of water and alcohol molecules and the formation of Si—O—Si linkages. In this mechanism, the as-deposited film does not have appreciable carbon content even though the alkoxysilane precursor contains carbon. In certain embodiments, reactant partial pressure is controlled to facilitate bottom up fill. Liquid condensation can occur below saturation pressure in narrow gaps; the reactant partial pressure controls the capillary condensation. In certain embodiments, reactant partial pressure is set slightly below the saturation pressure. In a hydrolyzing medium, the silicon-containing precursor forms a fluid-like film on the wafer surface that preferentially deposits in trenches due to capillary condensation and surface tension forces, resulting in a bottom-up fill process.

Figure 4B:
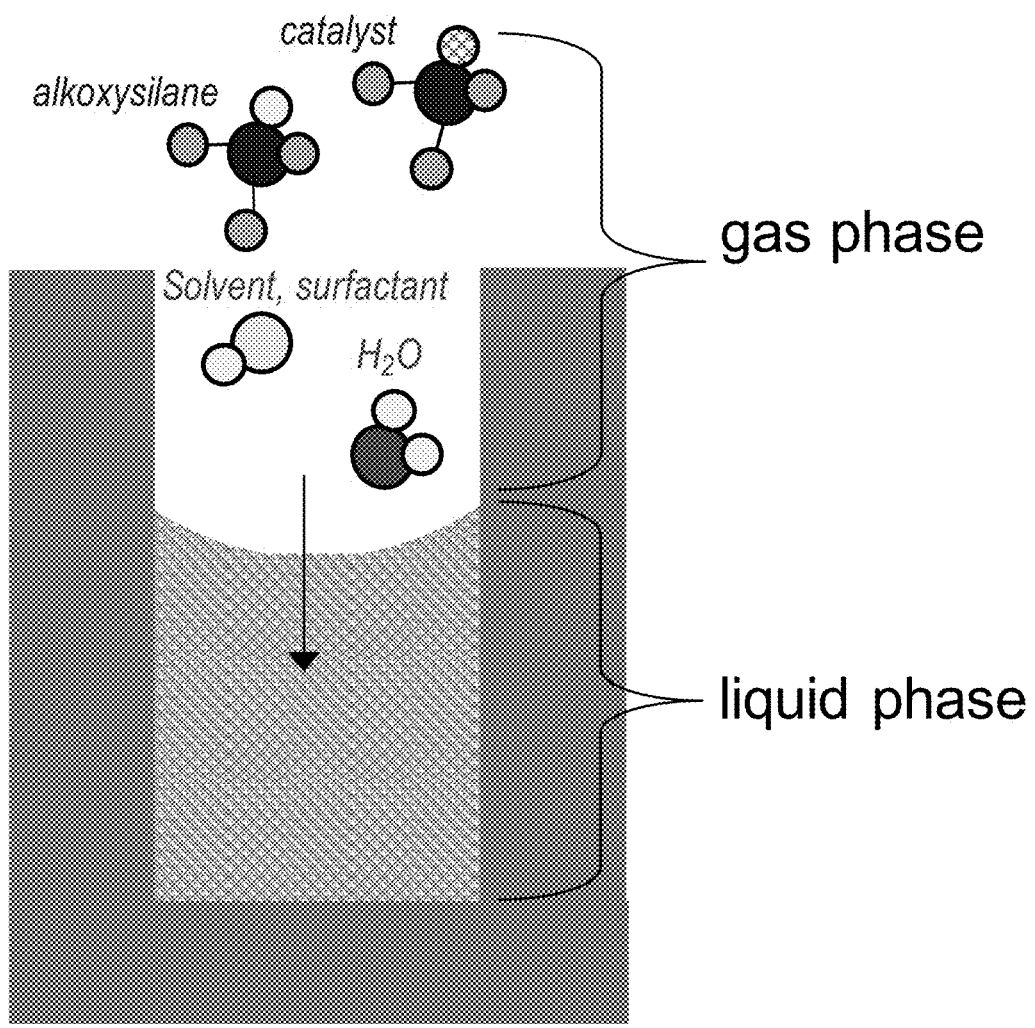
FIG. 4B is a schematic depiction of liquid condensation in a patterned feature.

FIG. 4B provides a simplified schematic diagram of an example of a liquid condensation in a patterned feature. FIGS. 5A-5D provides a simplified schematic diagram of deposition and anneal reaction mechanisms according to one embodiment. It should be noted that the methods described herein are not limited to the particular reactants, products and reaction mechanisms depicted, but may be used with other reactants and reaction mechanisms that produce flowable dielectric films. It will also be understood that deposition and annealing may involve multiple different concurrent or sequential reaction mechanisms.

Figure 5A:
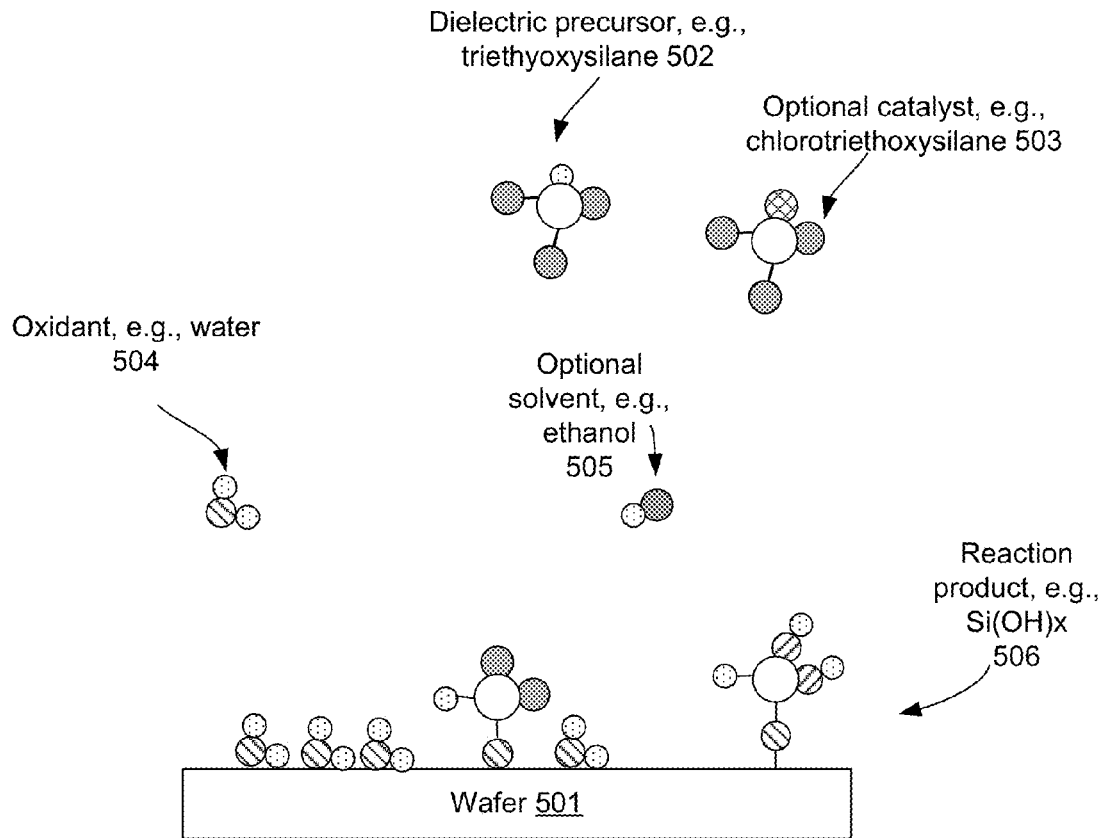
FIGS. 5A-5D are schematic depictions of reaction mechanisms in an example of a method of filling a gap with dielectric material according to certain embodiments.

FIG. 5A depicts reactant condensation, hydrolysis and initiation of the flowable film on a wafer 501, held at a reduced temperature such as −5° C. The reactants include a dielectric precursor 502, an oxidant 504, an optional catalyst 503 and an optional solvent 505. The dielectric precursor absorbs 502 on the surface. A liquid phase reaction between the precursor and oxidant results in hydrolysis of the precursor, forming a product 506, e.g., silanols Si(OH)x attached to the wafer surface initiating the growth of the film. In certain embodiments, the presence of the solvent improves miscibility and surface wettability.

Figure 5B:
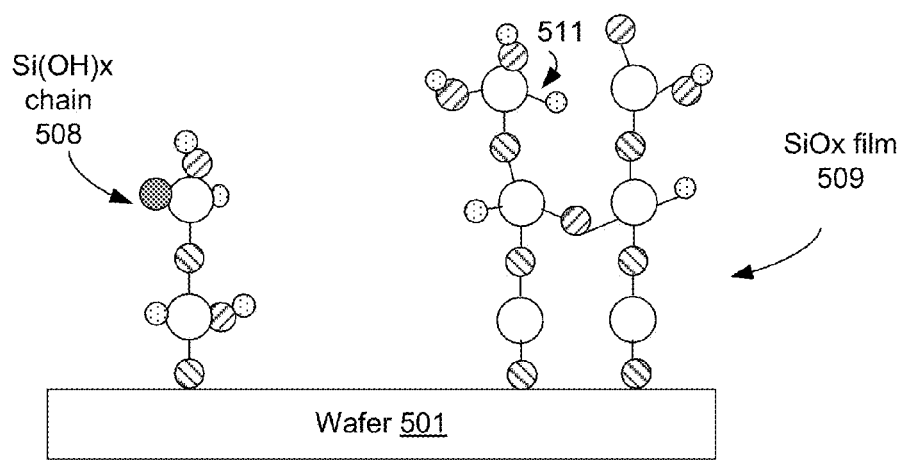
Figure 5C:
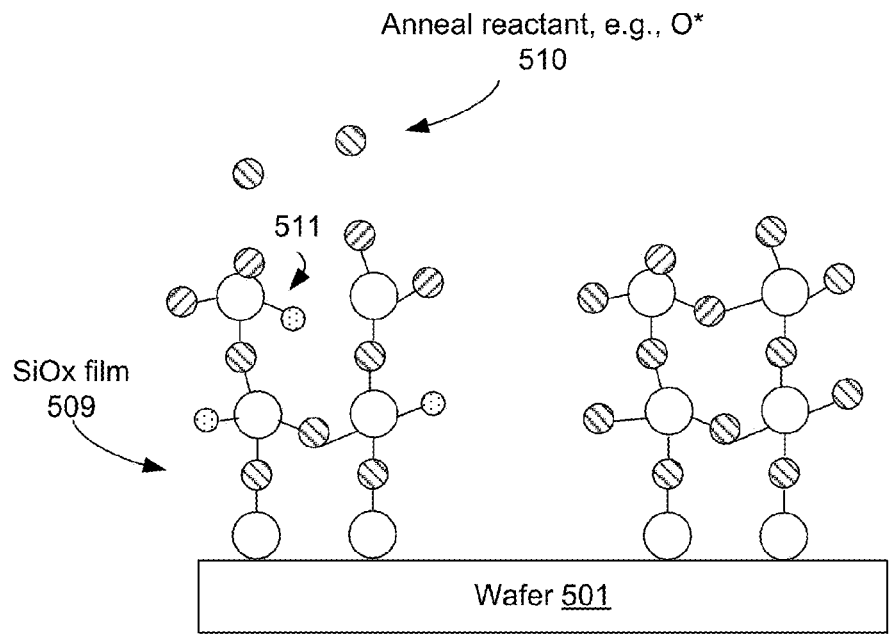

FIG. 5B depicts polymerization of the product (see Si(OH)x chain 508) as well as condensation of the silanols to form crosslinked Si—O chains. The result of the condensation reaction is a film 509. At this stage, the organic groups may be substantially eliminated from the film 509, with alcohol and water released as byproducts, though as depicted Si—H groups 511 remain as do hydroxyl groups. In some cases, a minute but detectable amount of carbon groups remains. The overall carbon content may be less than 1% (atomic). In some embodiments, essentially no carbon groups remain, such that Si—C groups are undetectable by FTIR as shown in FIG. 6. FIG. 5C depicts a reaction mechanism during an anneal, in this case in the presence of an activated oxygen species O* (510), e.g. oxygen radicals, ions, etc. In certain embodiments, the anneal has two effects: 1) oxidation of the film, to convert SiOH and SiH to SiO; and 2) film densification or shrinkage. The oxygen oxidizes Si—H bonds and faciliates formation of a SiOx network with substantially no Si—H groups. The substrate temperature may be raised, e.g., to 375° C. to facilitate film shrinkage and oxidization. In other embodiments, the oxidation and shrinkage operations are carried out separately. In some embodiments, oxidation may occur at a first temperature (e.g., 200° C.) with further densification occurring at a higher temperature (e.g., 375° C.).

Figure 5D:
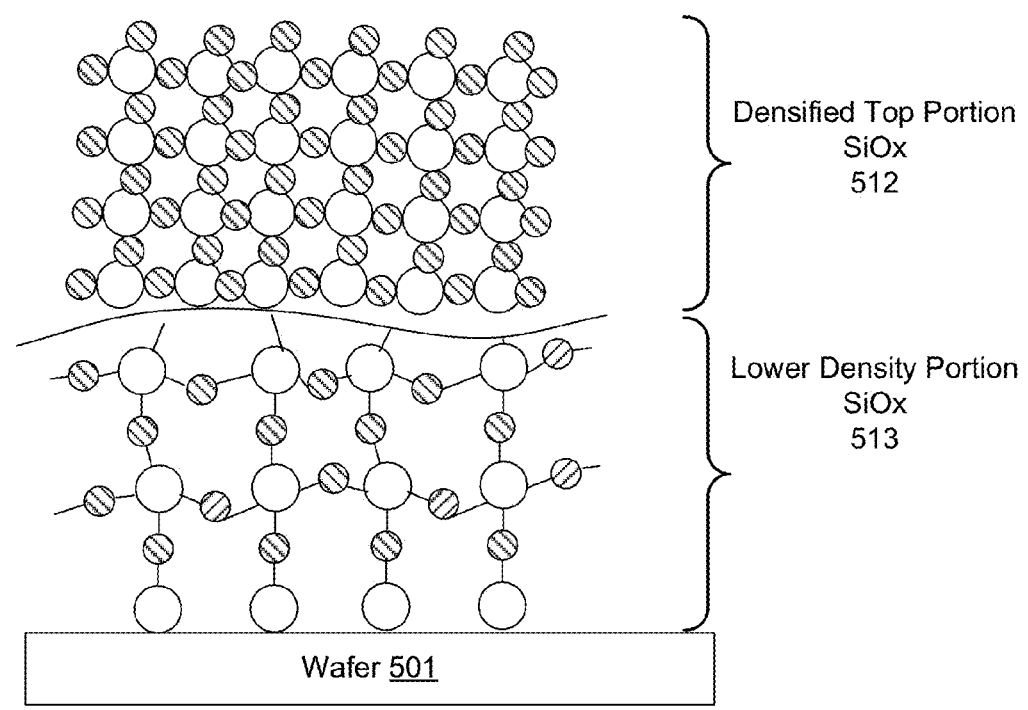

According to various embodiments, the high density region and the low density region are both oxidized, that is, Si—H groups are replaced with Si—O groups in both regions. However, only the high density region is densified or shrunk. In certain embodiments, the low density region may have a significant number of Si—H groups remaining FIG. 5D shows a schematic depiction of a film including a low density region 513 and a high density region 512. Region 512 is a dense SiO network; region 513 is a lower density SiO network. In the depicted embodiment, the lower density region is substantially completely oxidized, but not densified. In certain embodiments, some hydroxyl groups and Si—H groups remain in the region 513.

Figure 7:
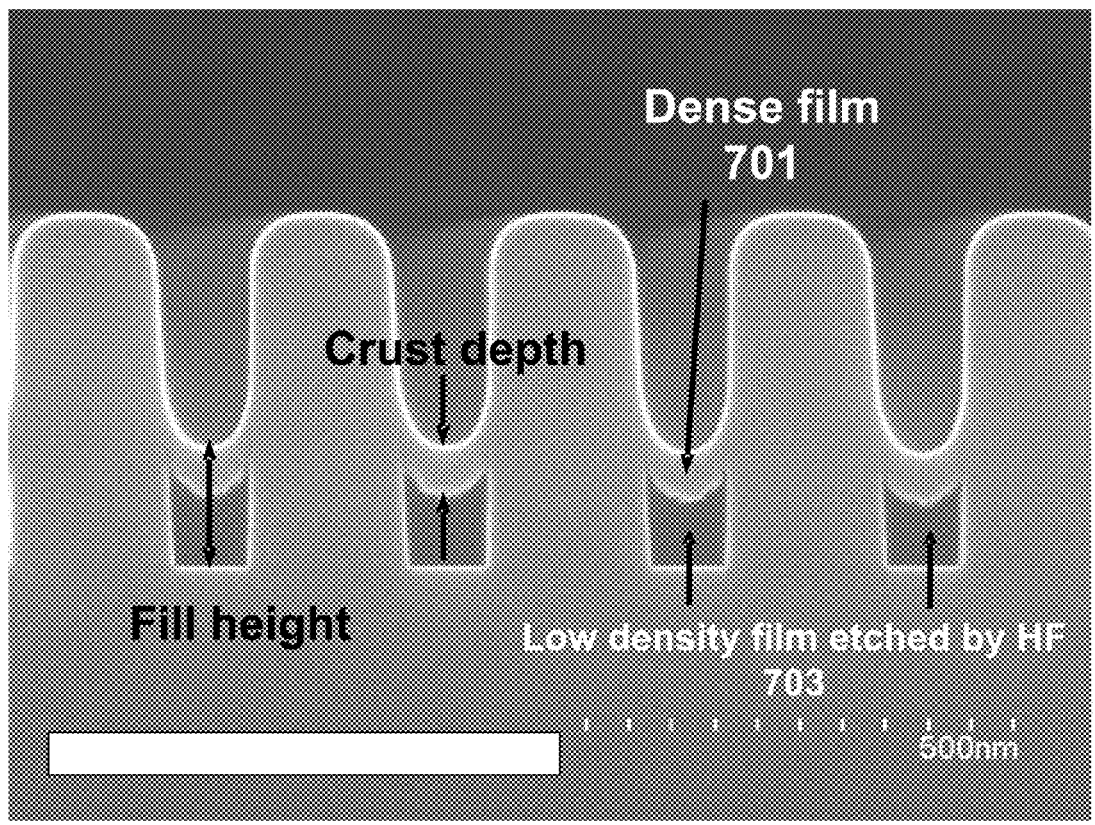
FIG. 7 is an image of a gap filled with dielectric material according to certain embodiments after exposure to a dilute HF etchant.

FIG. 7 provides a cross-sectional image of a gap filled and partially densified in a single cycle. The image is after an HF dip that etches the low density film, and shows dense film region 701 and low density region 703. As seen in the figure, the process results in two distinct regions, rather than a density gradient extending from the top to the bottom of the filled gap. The integration schemes described herein may also be used with gap fill processes that result in a continuous density gradient or gradients, rather than the bimodal density distribution shown in FIG. 7.

Without being bound by any particular theory, it is believed that densification in the gap is limited by film constraints: looking at a cross-section as shown in FIG. 7, film in the gap is constrained on three sides, by the sidewalls and the bottom of the gap, with the top of the gap the only free surface. As the critical dimension decreases, less free surface is available, less relaxation is possible and the crust or high density region formed is thinner. This is shown experimentally in FIG. 4A, discussed above, in which the crust thickness (max densification depth) decreases with critical dimension. The film below the high density region does not densify. It has been found however, that while the constraints formed by the gap walls and crust prevent densification, oxygen is able to diffuse through the crust, forming low density SiO as depicted schematically in FIG. 5D.

There may be an interface between the high density region and the low density region. This interface may be characterized by a density gradient. In addition, each of the high and low density regions may also have a density gradient. However, as shown in FIG. 7 and schematically in FIG. 5D, the density difference between the low density region and high density region is observable and exceeds any differences within these regions.

As indicated above, the reaction mechanism in FIGS. 5A-5D is but one example of a reaction mechanism that may be used in accordance with the present invention, depending on the particular reactants. For example, in certain embodiments, peroxides are reacted with silicon-containing precursors such as alkylsilanes to form flowable films including carbon-containing silanols. One of skill in the art will understand that other known flowable film processes including spin on processes as well as vapor deposition processes may be used to implement certain embodiments described herein.

In other embodiments, Si—C or Si—N containing dielectric precursors may be used, either as a main dielectric precursor or a dopant precursor, to introduce carbon or nitrogen in the gel formed by a hydrolysis and condensation reaction as described in FIGS. 5A-5D. For example, triethoxysilane may be doped with methyl-triethoxysilane ($CH_3Si(OCH_2)_3$) to introduce carbon into the as-deposited film.

Still further, in certain embodiments the as-deposited film is a silicon nitride film, including primarily Si—N bonds with N—H bonds. Such a film may be densified as described above. In certain embodiments, it may be primarily Si—N after treatment; or may be oxidized to form an Si—O network or a SiON network. Post-deposition conversion treatments may remove nitrogen and/or amine groups.

In certain embodiments, the flowable dielectric film may be a silicon and nitrogen-containing film, such as silicon nitride or silicon oxynitride. It may be deposited by introducing vapor phase reactants to a deposition chamber at conditions such that they react to form a flowable film. The vapor phase reactants may include species created by a plasma. Such a plasma may be generated remotely or in the deposition chamber. The nitrogen incorporated in the film may come from one or more sources, such as a silicon and nitrogen-containing precursor (for example, trisilylamine (TSA) or disilylamine (DSA)), a nitrogen precursor (for example, ammonia (NH3) or hydrazine (N2H4)), or a nitrogen-containing gas fed into a plasma (N2, NH3, NO, NO2, N2O). After deposition, the flowable dielectric film may be treated to do one of more of the following: chemical conversion of the as-deposited film, densification. The chemical conversion may include removing some or all of the nitrogen component, converting a $Si(ON)_x$ film to a primarily SiO network. It may also include removal of one or more of —H, —OH, —CH and —NH species from the film. As described above, post-deposition treatment may include exposure to thermal, chemical, plasma, UV, IR or microwave energy.

Post-Processing Treatment of Dielectric Gap Fill

As described above with reference to operation 111 in FIG. 1B, in certain embodiments, flowable dielectric film exposed during a first etch may be treated prior to a subsequent wet etch. For example, a flowable oxide film exposed during a dry contact etch may be treated prior to a contact wet clean. Similarly, in any integration scheme in which the flowable dielectric material is exposed, the exposed material may be treated prior to subsequent processing. For example, any of the treatments may be performed following CMP prior to post-CMP clean. In certain embodiments, the treatment reduces or minimizes the etch rate of the flowable oxide film. In the case of a post-contact etch treatment, it may reduce the lateral etch rate of the sidewalls of the contact hole near the bottom of the hole. In the case of a post-CMP treatment, it may reduce the etch rate to the top film surface exposed during the polish step.

According to various embodiments, the treatment involves one or more of a treatment to densify the sidewall or other exposed dielectric and deposition of a thin conformal liner on the exposed dielectric. As indicated above, in certain embodiments, the gap fill material is only partially densified, with the gap fill having a top high density portion and a bottom lower density portion. In situations in which a dry etch, CMP process, or other removal process exposes lower density film, the treatment operation is directed at the exposed lower density film. According to various embodiments, exposed portions of the higher density film may or may not be treated. For example, a further densification operation may further densify the high density film, or may have relatively little effect on it. A liner may be deposited on all or only a portion sidewalls of the etch hole, e.g., just on the portion of the sidewalls formed by the lower density portion or just on the portion of the sidewalls formed by flowable oxide.

Exemplary densification operations are described above with reference to operation 305 of FIG. 3. If a densification operation has been previously performed to partially densify the as-deposited gap fill film, the subsequent post-processing densification may be the same or a different process. For example, a first densification operation may involve a oxidizing plasma, while the treatment operation may involve a nitridizing plasma. As described above, the densification may involve a thermal, ultra-violet or plasma-based cure, and may be performed in an inert, oxidizing or nitridizing environment.

Deposition of a thin conformal oxide liner may be performed by PECVD conformal film deposition (CFD), pulsed deposition liner (PDL) or atomic layer deposition (ALD). ALD and PDL methods of forming thin silica layers are described in the following: U.S. Pat. Nos. 7,288,463; 7,491,653; and 7,271,112, which are incorporated by reference herein. In such cases, deposition may be followed by a directional etch to remove the liner from the contact. This may be done during the subsequent contact clean.

Etch Selectivity

According to various embodiments, the processes described herein provide dielectric gap fill material that exhibit uniform wet and/or dry etch selectivities. In certain embodiments, a gap filled with a dual density material is etched with the etch selectivity, and thus the etch rate, of the etched material being substantially uniform. This allows formation of trenches, contact holes, and other recessed features in the gap fill material without creating undercuts or re-entrant features.

Figure 8:
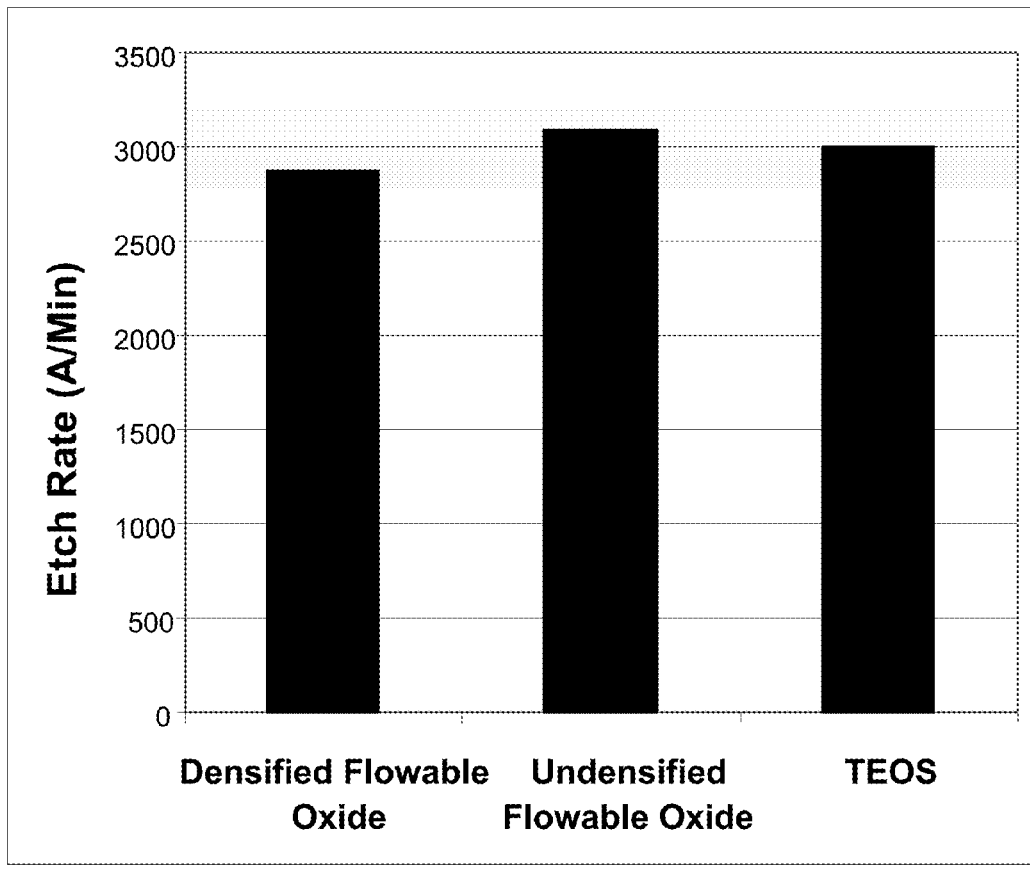
FIG. 8 is a chart comparing dry etch rates of densified and undensified flowable oxide according to certain embodiments to that of TEOS oxide.

Dry etch selectivities of as-deposited and densified flowable oxide films were compared to that TEOS oxide. The flowable oxide films were deposited using TES and water, with an ethanol solvent. The flowable oxide film was densified using a remote oxygen plasma. FIG. 8 shows dry plasma etch rates of the films. As can be seen, the dry plasma etch rate of the low density flowable oxide is about equal to that of the densified flowable oxide film and that of the PECVD-deposited TEOS oxide film. This indicates that the dry etch selectivity ratios of low density flowable oxide film, densified flowable oxide film, and TEOS oxide are about 1:1:1. Performing a contact etch (as illustrated in FIG. 2I) results in substantially straight sidewalls, as the overburden layer (e.g., TEOS oxide or flowable oxide), high density gap fill region and lower density gap fill region are etched at the same rate.

In certain embodiments, gap fill material is treated prior to subsequent processing, including wet etching. As discussed above, this may involve densifying gap fill material that is to be exposed to wet etchant and/or depositing a conformal liner layer on the gap fill material. In certain embodiments, this lowers the wet etch rate of the flowable oxide material.

In the same or other embodiments, the gap fill material is doped to lower the wet etch rate of the material relative to $SiO_2$. The doped gap fill material may be high density or low density flowable oxide. According to various embodiments, carbon-containing and/or nitrogen-containing dopants are introduced during deposition and/or post deposition treatment.

For example, triethoxysilane may be doped with methyl-triethoxysilane ($CH_3Si(OCH_2)_3$) to introduce carbon into the as-deposited film. In an alternative implementation, the methyltriethoxysilane may be used on its own to deposit a carbon-containing film, without another precursor. Other examples of carbon-doped precursors include trimethylsilane (3MS), tetramethylsilane (4MS), diethoxymethylsilane (DEMS), dimethyldimethoxysilane (DMDMOS), methyl-trimethoxysilane (MTMS), methyl-diethoxysilane (MDES), methyl-dimethoxysilane (MDMS) and cyclic azasilanes. Additional carbon-doped precursors are described above. In certain embodiments, the film is doped with extra silicon.

In the same or other embodiments, the film may be doped during anneal, by exposing the film to a carbon-containing, nitrogen-containing and/or silicon-containing atmosphere. As described above, this may be done in the presence of an energy source, e.g., thermal, UV, plasma, or microwave energy.

In the same or other embodiments, carbon doping can involving using certain catalysts. Examples of catalysts that may be used for carbon-doped films include chloromethyldiethoxysilane, chloromethyldimethoxysilane, and vinyltrichlorosilane.

In certain embodiments, doped films as described herein are used to form dual density filled gaps as described above. The doped films may also be used in filled gaps having uniform density, formed by multi- or single-cycle processes. In either case, the doped material has reduced wet etch rate and more uniform etch selectivity, for example, with other dielectric with types of oxides.

Figure 9A:
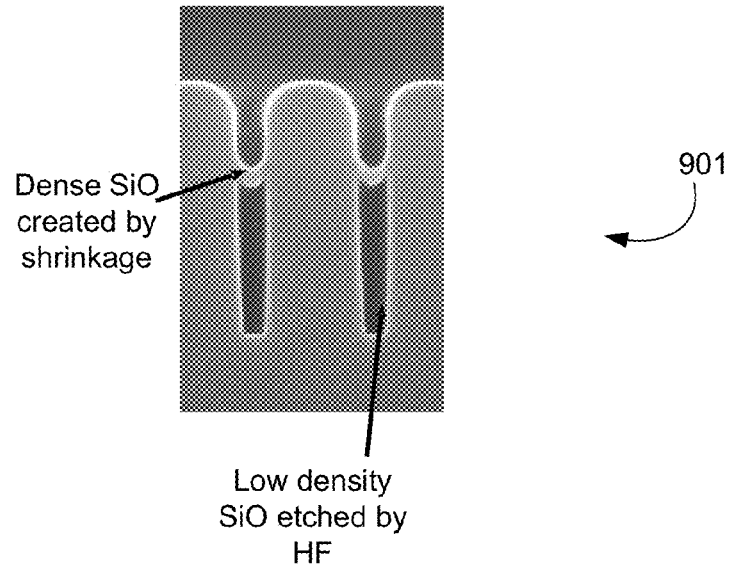
FIG. 9A shows images of gaps filled with densified $SiO_2$ and densified SiON films according to certain embodiments after exposure to a dilute HF etchant.
Figure 9A:
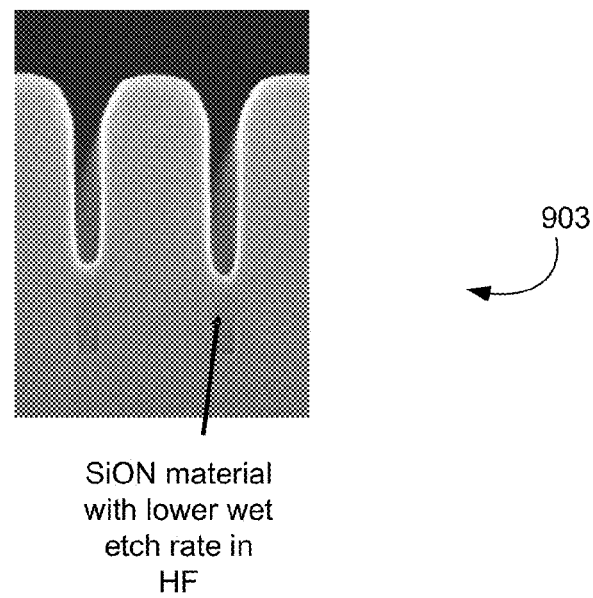

FIG. 9A shows an image 901 of a dual density filled gap after an oxidizing cure (remote $O_2$ plasma) an exposure to dilute HF, and an image 903 of a filled gap after a nitridizing cure (N2 HDP plasma). As shown, the N2 plasma treated film has a lower etch rate than the $O_2$ plasma treated film. Both films were deposited from TES/H2O.

In certain embodiments, a carbon-doped dielectric precursor is used either as the only dielectric precursor, or in combination with another dielectric precursor. For example, methyltriethoxysilane (MTES) is used to deposit a flowable low-k dielectric film. MTES may be used alone or with one or more precursors such as TES. In certain embodiments, after deposition, the deposited material is exposed to a non-oxidizing cure, e.g., such as exposure to a hydrogen-containing plasma, nitridizing plasma, a thermal cure in a nitrogen or other non-oxygen ambient, or exposure to UV radiation in a non-ozone generating ambient. The cure may serve to densify, change the chemical composition of, or change the physical properties of the flowable oxide material. In some cases, an oxidizing plasma may be used to reduce the carbon concentration in the film by reacting with and removing carbon species.

Figure 9B:
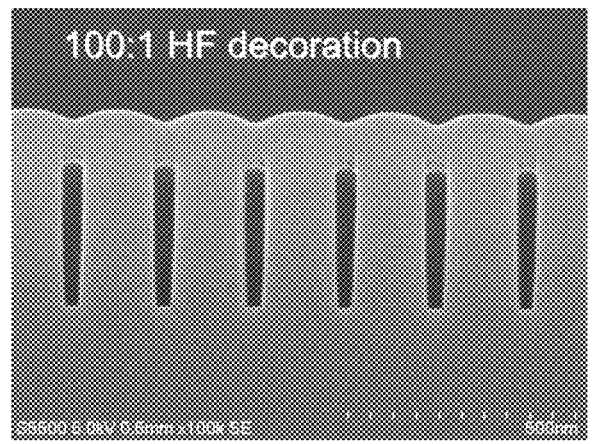
FIG. 9B shows images of gaps filled using a dielectric precursor and a carbon-doped dielectric precursor according to certain embodiments after exposure to a dilute HF etchant.
Figure 9B:
Figure 9B:
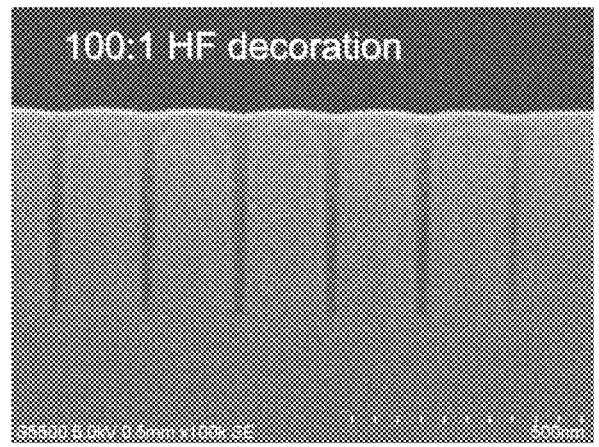
Figure 9B:

FIG. 9B shows images 905 and 907 of filled gaps after exposure to dilute HF. Gaps filled using TES (only)/H2O are shown in image 905; gaps filled using MTES (only)/H2O are shown in image 907. As shown, the MTES-deposited film has a lower wet etch rate than the TES-deposited film. Both films were deposited after a O2/N2 plasma pretreatment and were cured in the presence of N2 at 340° C. (no plasma). While the low wet etch rate dielectric fill was depositing using only a carbon-doped dielectric precursor, wet etch rate may be modified by doping a dielectric precursor with one or more of the carbon-doped precursors described above. In addition to having lower wet etch rates, films deposited using carbon-doped precursors as described also have lower dielectric constants in certain embodiments.

In certain embodiments, the carbon-doped precursor, either alone or with another dielectric precursor, is reacted with a non-peroxide compound. For example, any of MTES, 3MS, 4MS, DEMS, DMDMOS, MTMS, MDES, MDMS or cyclic azasilanes may be reacted with any of ozone ($O_3$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$).

Figure 9C:
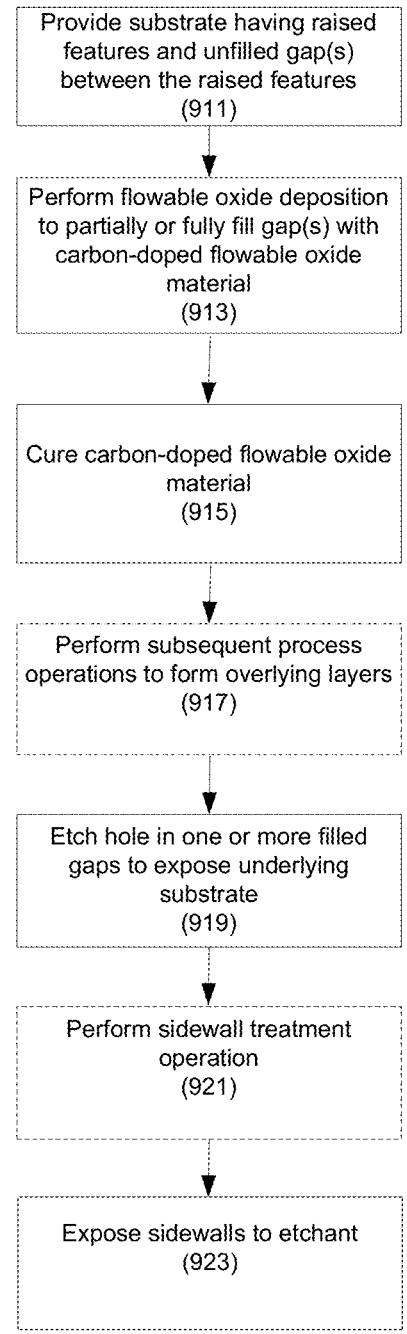
FIG. 9C is process flow diagrams illustrating operations in semiconductor processing methods according to certain embodiments.

FIG. 9C shows one example of a process using a carbon-doped precursor. A method begins by providing a substrate having one or more raised features and unfilled gaps between those features. (Block 911). An example is a gap between two gate structures at the device level of a partially fabricated integrated circuit. Typically, the gaps are narrow, having critical dimensions on the order of about 1-50 nm, in some cases between about 2-30 nm or 4-20 nm, e.g. 13 nm. This refers to the width of the gap opening at its narrowest point. The methods are not necessarily limited to these ranges, but can be used with smaller or larger gaps as well. In certain embodiments, one or more of the gaps on the substrate is re-entrant, i.e., the sidewalls of the gap narrow from the bottom of the gap towards the gap opening.

The method continues by performing a flowable oxide deposition operation to partially or wholly fill the gaps with a carbon-doped flowable oxide material. (Block 913). Flowable oxide deposition may include one or more pre-treatment operations. In certain embodiments, the gap is filled using a single flowable oxide deposition cycle. In other embodiments, multiple deposition cycles may be employed. A carbon-doped dielectric precursor is used, either alone or with one or more doped or undoped dielectric precursors.

Next, the as-deposited flowable oxide material is exposed to a post-deposition cure operation. (Block 915). The cure may serve to densify, change the chemical composition of, or change the physical properties of the flowable oxide material. In some cases, an oxidizing plasma may be used to reduce the carbon concentration in the film by reacting with and removing carbon species.

After the cure, one or more additional layers are optionally formed on the substrate. (Block 917). For example, in certain embodiments, another dielectric layer is formed over the filled gap, e.g., by a flowable oxide or TEOS oxide deposition process. This may or may not take place after various other operations, such as formation of structures, CMP, etc. In a subsequent operation, a hole, e.g., a contact hole, is formed in the gap fill material to expose a surface of the underlying substrate. (Block 919). The remaining gap fill material forms at least part of the sidewalls of the hole. A sidewall treatment operation is then optionally performed (Block 921). According to various embodiments, this may be an additional cure or densification operation and/or deposition of a liner material on at least a portion of the sidewalls. Treatment operations are discussed further below. The structure is then exposed to a wet or dry etchant (Block 923).

Flowable Oxide Deposition Reactors

The methods of the present invention may be performed on a wide-range of reaction chambers. The methods may be implemented on any chamber equipped for deposition of dielectric film, including HDP-CVD reactors, PECVD reactors, sub-atmospheric CVD reactors, any chamber equipped for CVD reactions, and chambers used for PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate. Examples of suitable reactors are the Sequel™ reactor, the Vector™, the Speed™ reactor, all available from Novellus Systems of San Jose, Calif.

Figure 10:
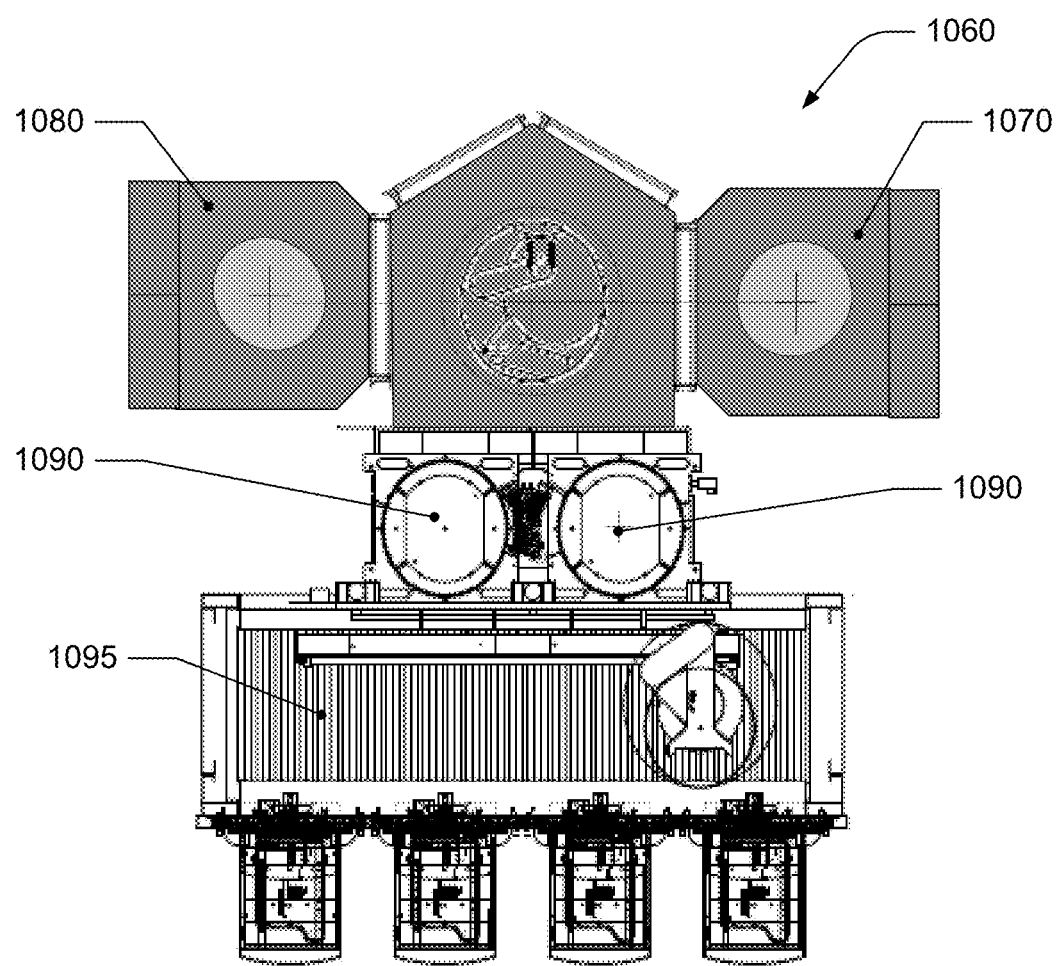
FIG. 10 is a top view diagram illustrating a multi-station apparatus suitable for practicing selected embodiments.

FIG. 10 provides an example tool configuration 1060 including wafer transfer system 1095 and loadlocks 1090, cure module 1070, and flowable gap fill module 1080. An additional cure module 1070 and/or flowable gap fill module 1080 may also be included. Cure module 1070 may be a plasma cure module, e.g., a remote plasma cure module, or an inductively or capacitively coupled cure module. In other embodiments, cure module 1070 is a UV cure module or a thermal cure module. In embodiments in which an in-situ anneal is performed, cure module 1070 may not be present.

Figure 11:
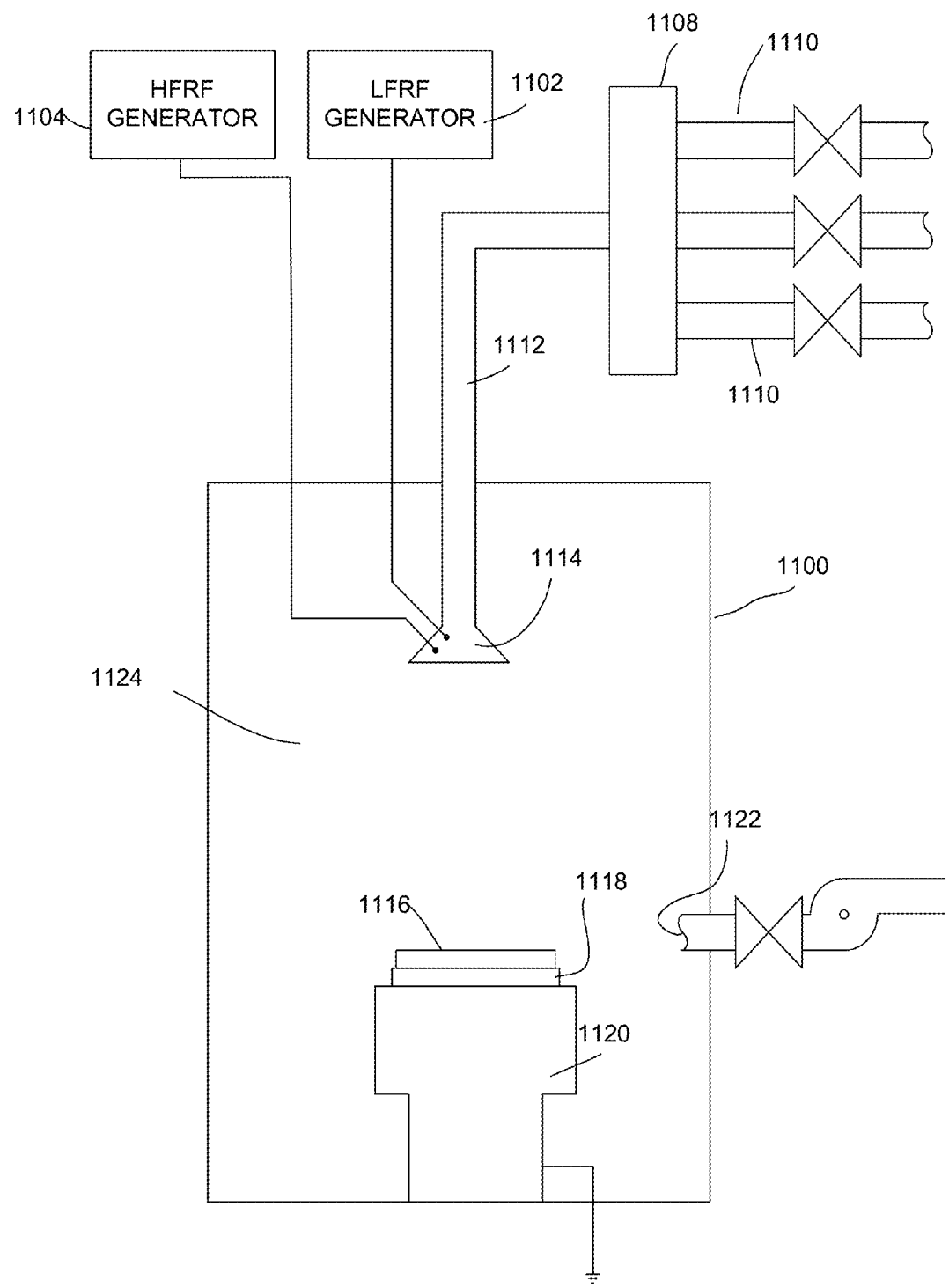
FIG. 11 is a schematic diagram illustrating a deposition and/or chamber suitable for practicing various embodiments.

FIG. 11 shows an example of a reactor that may be used in accordance with certain embodiments of the invention, as a deposition chamber, a treatment and deposition chamber, or as an independent cure module. The reactor shown in FIG. 11 is suitable for both the dark (non-plasma) or plasma-enhanced deposition and as well as cure, for example, by capacitively-coupled plasma anneal. As shown, a reactor 1100 includes a process chamber 1124, which encloses other components of the reactor and serves to contain the plasma generated by a capacitor type system including a showerhead 1114 working in conjunction with a grounded heater block 1120. A low-frequency RF generator 1102 and a high-frequency RF generator 1104 are connected to showerhead 1114. The power and frequency are sufficient to generate a plasma from the process gas, for example 50 W to 5 kW total energy. In the implementation of the present invention, the generators are not used during dark deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 1118 supports a substrate 1116. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 1112. Multiple source gas lines 1110 are connected to manifold 1108. The gases may be premixed or not. The temperature of the mixing bowl/manifold lines should be maintained at levels above the reaction temperature. Temperatures at or above about 80 C. at pressures at or less than about 100 Torr usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 1100 via an outlet 1122. A vacuum pump 1126 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 12:
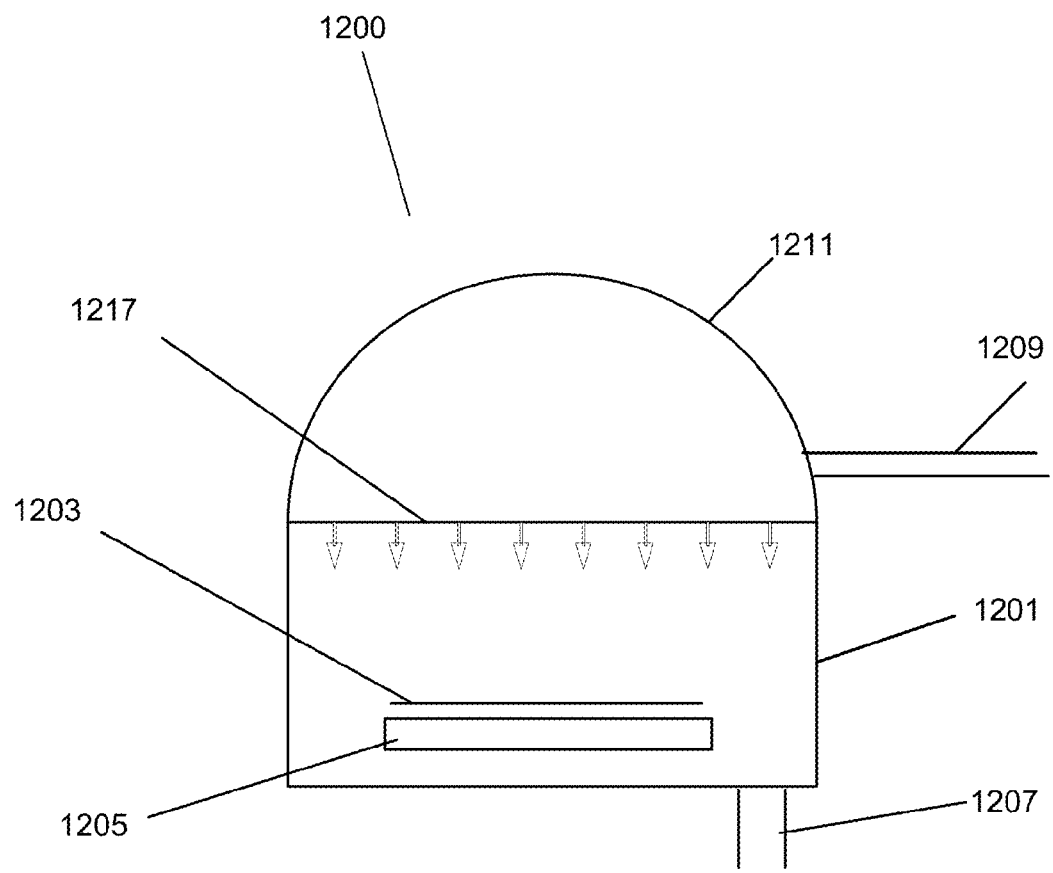
FIG. 12 is simplified illustration of a cure module suitable for practicing various embodiments.

FIG. 12 illustrates a simplified embodiment of a cure module according to certain embodiments. Apparatus 1200 has a plasma producing portion 1211 and an exposure chamber 1201 separated by a showerhead assembly or faceplate 1217.

Inside exposure chamber 1201, a platen (or stage) 1205 provides a wafer support. Platen 1205 is fitted with a heating/cooling element. In some embodiments, platen 1205 is also configured for applying a bias to wafer 1203. Low pressure is attained in exposure chamber 1201 via vacuum pump via conduit 1207. Sources of gaseous treatment gases provide a flow of gas via inlet 1209 into plasma producing portion 1211 of the apparatus. Plasma producing portion 1211 may surrounded by induction coils (shown). During operation, gas mixtures are introduced into plasma producing portion 1211, the induction coils are energized and a plasma is generated in plasma producing portion 1211. Showerhead assembly 1217 may have an applied voltage and terminates the flow of some ions and allows the flow of neutral species into exposure chamber 1201.

Figure 13:
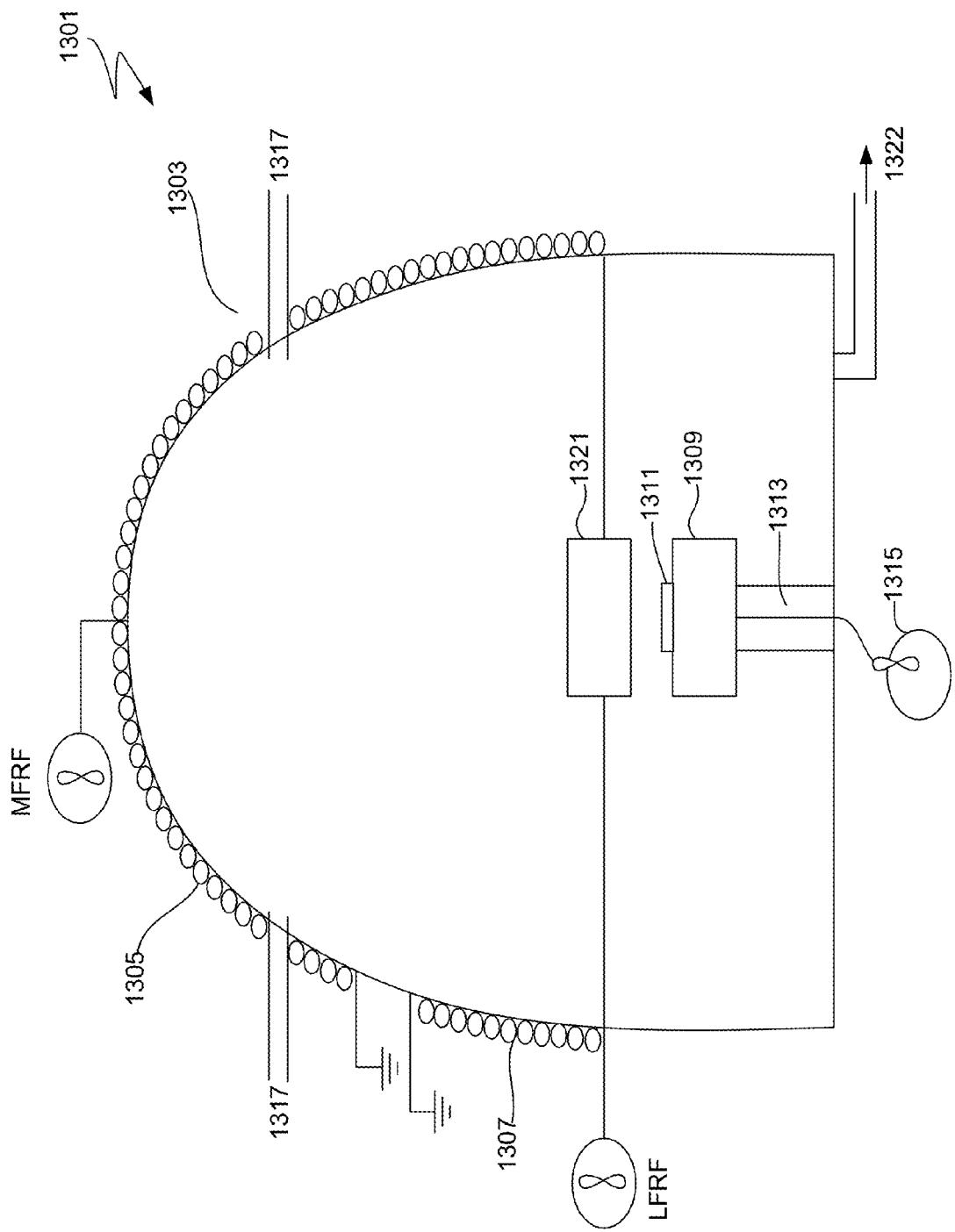
FIG. 13 is simplified illustration of a HDP-CVD module suitable for practicing various embodiments.

FIG. 13 is a simplified illustration of various components of a HDP-CVD apparatus that may be used for pre- and/or post-deposition treatment or cures according to various embodiments. As shown, a reactor 1301 includes a process chamber 1303 which encloses other components of the reactor and serves to contain the plasma. In one example, the process chamber walls are made from aluminum, aluminum oxide, and/or other suitable material. The embodiment shown in FIG. 13 has two plasma sources: top RF coil 1305 and side RF coil 1307. Top RF coil 1305 is a medium frequency or MFRF coil and side RF coil 1307 is a low frequency or LFRF coil. In the embodiment shown in FIG. 13, MFRF frequency may be from 430-470 kHz and LFRF frequency from 340-370 kHz. However, apparatuses having single sources and/or non-RF plasma sources may be used.

Within the reactor, a wafer pedestal 1309 supports a substrate 1311. A heat transfer subsystem including a line 1313 for supplying heat transfer fluid controls the temperature of substrate 1311. The wafer chuck and heat transfer fluid system can facilitate maintaining the appropriate wafer temperatures.

A high frequency RF of HFRF source 1315 serves to electrically bias substrate 1311 and draw charged precursor species onto the substrate for the pre-treatment or cure operation. Electrical energy from source 1315 is coupled to substrate 1311 via an electrode or capacitive coupling, for example. Note that the bias applied to the substrate need not be an RF bias. Other frequencies and DC bias may be used as well.

The process gases are introduced via one or more inlets 1317. The gases may be premixed or not. The gas or gas mixtures may be introduced from a primary gas ring 1321, which may or may not direct the gases toward the substrate surface. Injectors may be connected to the primary gas ring 1321 to direct at least some of the gases or gas mixtures into the chamber and toward substrate. The injectors, gas rings or other mechanisms for directing process gas toward the wafer are not present in certain embodiments. Process gases exit chamber 1303 via an outlet 1322. A vacuum pump typically draws process gases out and maintains a suitably low pressure within the reactor. While the HDP chamber is described in the context of pre- and/or post-deposition treatment or cure, in certain embodiments, it may be used as a deposition reactor for deposition of a flowable film. For example, in a thermal (non-plasma) deposition, such a chamber may be used without striking a plasma.

FIGS. 11-13 provide examples of apparatuses that may be used to implement the pre-treatments described herein. However, one of skill in the art will understand that various modifications may be made from the description.

In certain embodiments, a system controller is employed to control process parameters. The system controller typically includes one or more memory devices and one or more processors. The processor may include a CPU or computer, analog and/or digital input/output connections, stepper motor controller boards, etc. Typically there will be a user interface associated with system controller. The user interface may include a display screen, graphical software displays of the apparatus and/or process conditions, and user input devices such as pointing devices, keyboards, touch screens, microphones, etc. The system controller may be connected to any or all of the components shown in FIG. 10 of a tool; its placement and connectivity may vary based on the particular implementation.

In certain embodiments, the system controller controls the pressure in the processing chambers. The system controller may also control concentration of various process gases in the chamber by regulating valves, liquid delivery controllers and MFCs in the delivery system as well as flow restriction valves an the exhaust line. The system controller executes system control software including sets of instructions for controlling the timing, flow rates of gases and liquids, chamber pressure, substrate temperature, and other parameters of a particular process. Other computer programs stored on memory devices associated with the controller may be employed in some embodiments. In certain embodiments, the system controller controls the transfer of a substrate into and out of various components of the apparatuses shown in FIG. 10.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

The disclosed methods and apparatuses may also be implemented in systems including lithography and/or patterning hardware for semiconductor fabrication. Further, the disclosed methods may be implemented in a process with lithography and/or patterning processes preceding or following the disclosed methods. The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

The invention claimed is:

1. A method for filling a recessed feature with dielectric material, comprising:
providing a workpiece including gate structures disposed on a substrate, with a gap between the gate structures;
filling the gap with a flowable dielectric material, filling the gap comprising flowing process gasses into a deposition chamber housing the substrate under the conditions such that a flowable film forms and fills the gap; and
partially densifying the flowable dielectric material to form a dual density filled gap comprising a lower density dielectric fill region capped by a higher density dielectric fill region.

2. The method of claim 1 further comprising performing subsequent processing operations comprising at least one of chemical mechanical planarization and contact etch on the substrate.

3. The method of claim 1 further comprising etching a hole within the filled gap to expose an underlying contact, such that sidewalls of the hole include exposed dielectric fill material.

4. The method of claim 3 further comprising densifying at least a portion of the exposed dielectric fill material.

5. The method of claim 3 further comprising depositing a liner on at least a portion of the exposed dielectric fill material.

6. The method of claim 1 wherein the flowable dielectric material is a silicon nitride material.

7. The method of claim 1 wherein the gap is filled using a single cycle deposition.

8. The method of claim 1 wherein partially densifying the flowable dielectric material comprises exposing it to an oxidizing radicals from a downstream or direct plasma.

9. The method of claim 1 wherein partially densifying the flowable dielectric material comprises exposing it to ultraviolet radiation in a non-oxidizing environment.

10. The method of claim 1 wherein partially densifying the flowable dielectric material comprises exposing it to an oxidant in the presence of ultraviolet radiation.

11. The method of claim 1 wherein partially densifying the flowable dielectric material comprises exposing to a nitridizing radicals from a downstream or direct plasma.

12. The method of claim 1 wherein partially densifying the flowable dielectric material comprises removing at least one of hydrogen (—H), hydroxyl (—OH), alkyl (—CH) or amine (—NH) groups from the flowable dielectric material.

13. The method of claim 1 wherein partially densifying the flowable dielectric material comprises removing amine groups from the flowable dielectric material.

14. The method of claim 1 wherein partially densifying the flowable dielectric material comprises forming Si—O—Si linkages.

15. A method for filling a gap, comprising:
providing a workpiece including a gap;
filling the gap with a flowable dielectric material;
performing a first treatment on the dielectric material in the gap;
after exposing the dielectric material to the first treatment, removing a portion of the dielectric material in the gap to create a hole including one or more sidewalls; and
after removing the portion of the dielectric material, performing a second treatment on the dielectric material in the gap.

16. The method of claim 15 wherein performing the first treatment comprises partially densifying the flowable dielectric material to form a dual density filled gap comprising a lower density dielectric fill region capped by a higher density dielectric fill region.

17. The method of claim 16 wherein removing a portion of the dielectric material comprises etching the dual density filled gap to expose a portion of the lower density dielectric fill region.

18. The method of claim 17 wherein performing the second treatment comprises treating the exposed portion of the lower density dielectric fill region.

19. The method of claim 17 wherein treating the exposed portion comprises densifying the exposed dielectric fill material.

20. The method of claim 17 wherein treating the exposed portion comprises depositing a liner thereon.

21. The method of claim 16 further comprising, after performing the second treatment, exposing the treated dielectric material to a wet etchant.

22. The method of claim 15 wherein at least one of the first and second treatments comprises exposing the dielectric material to a reactive oxidant in the presence of RF energy or ultraviolet radiation.

23. The method of claim 15 wherein at least one of the first and second treatments comprises exposing the dielectric material to ultraviolet radiation in an non-oxidizing environment.

24. The method of claim 1, wherein filling the gap with a flowable dielectric material comprises exposing the substrate to process gases under conditions such that a flowable film forms and fills the gap.

25. The method of claim 1, wherein the gate structures comprise transistor gates at the device level of a partially fabricated integrated circuit.

26. The method of claim 1, wherein the gate structures comprise dummy gate structures at the device level of a partially fabricated integrated circuit.

* * * * *